(12) United States Patent
Kanakamedala et al.

(10) Patent No.: US 10,622,368 B2
(45) Date of Patent: Apr. 14, 2020

(54) THREE-DIMENSIONAL MEMORY DEVICE WITH SEMICIRCULAR METAL-SEMICONDUCTOR ALLOY FLOATING GATE ELECTRODES AND METHODS OF MAKING THEREOF

(71) Applicant: SANDISK TECHNOLOGIES LLC, Addison, TX (US)

(72) Inventors: Senaka Kanakamedala, Milpitas, CA (US); Raghuveer S. Makala, Sunnyvale, CA (US); Rahul Sharangpani, Fremont, CA (US); Somesh Peri, San Jose, CA (US); Yao-Sheng Lee, Tampa, FL (US); James Kai, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 117 days.

(21) Appl. No.: 15/227,424

(22) Filed: Aug. 3, 2016

(65) Prior Publication Data
US 2018/0040623 A1 Feb. 8, 2018
US 2019/0371803 A9 Dec. 5, 2019

Related U.S. Application Data

(63) Continuation-in-part of application No. 14/748,670, filed on Jun. 24, 2015, now Pat. No. 9,728,546.

(51) Int. Cl.
*H01L 27/11556* (2017.01)
*H01L 27/11524* (2017.01)
*H01L 27/11548* (2017.01)

(52) U.S. Cl.
CPC .. *H01L 27/11556* (2013.01); *H01L 27/11524* (2013.01); *H01L 27/11548* (2013.01)

(58) Field of Classification Search
CPC .................................................. H01L 27/11556
See application file for complete search history.

(56) References Cited

U.S. PATENT DOCUMENTS 5,084,417 A 1/1992 Joshi et al.
5,583,360 A 12/1996 Roth et al.
(Continued)

FOREIGN PATENT DOCUMENTS

WO WO2002/015277 A2 2/2002
WO WO2013/154963 A2 10/2013

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Moazzam Hossain
*Assistant Examiner* — Hajar Kolahdouzan
(74) *Attorney, Agent, or Firm* — The Marbury Law Group, PLLC

(57) ABSTRACT

Azimuthally-split metal-semiconductor alloy floating gate electrodes can be formed by providing an alternating stack of insulating layers and spacer material layers, forming a dielectric separator structure extending through the alternating stack, and forming memory openings that divides the dielectric separator structure into a plurality of dielectric separator structures. The spacer material layers are formed as, or are replaced with, electrically conductive layers, which are laterally recessed selective to the insulating layers and the plurality of dielectric separator structures to form a pair of lateral cavities at each level of the electrically conductive layers in each memory opening. After formation of a blocking dielectric layer, a pair of physically disjoined metal-semiconductor alloy portions are formed in each pair
(Continued)

of lateral cavities as floating gate electrodes. A tunneling dielectric layer and a semiconductor channel layer is subsequently formed in each memory opening.

15 Claims, 16 Drawing Sheets

(56) References Cited

U.S. PATENT DOCUMENTS

| | | | |
|---|---|---|---|
| 5,807,788 | A | 9/1998 | Brodsky et al. |
| 5,897,354 | A | 4/1999 | Kachelmeier |
| 5,915,167 | A | 6/1999 | Leedy |
| 5,933,734 | A | 8/1999 | Feria et al. |
| 6,238,978 | B1 | 5/2001 | Huster |
| 6,953,697 | B1 | 10/2005 | Castle et al. |
| 7,005,350 | B2 | 2/2006 | Walker et al. |
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 7,906,392 | B2 | 3/2011 | Dunton et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,237,213 | B2 | 8/2012 | Liu |
| 8,283,228 | B2 | 10/2012 | Alsmeier |
| 8,349,681 | B2 | 1/2013 | Alsmeier et al. |
| 8,445,347 | B2 | 5/2013 | Alsmeier |
| 8,461,000 | B2 | 6/2013 | Alsmeier et al. |
| 8,461,641 | B2 | 6/2013 | Alsmeier et al. |
| 8,658,499 | B2 | 2/2014 | Makala et al. |
| 8,823,076 | B2 | 9/2014 | Lee et al. |
| 8,847,302 | B2 | 9/2014 | Alsmeier et al. |
| 8,853,765 | B2 | 10/2014 | Lee et al. |
| 8,928,061 | B2 | 1/2015 | Chien et al. |
| 8,981,457 | B2 | 3/2015 | Lee et al. |
| 8,987,119 | B2 | 3/2015 | Dunton et al. |
| 9,023,719 | B2 | 5/2015 | Pachamuthu et al. |
| 9,252,151 | B2 | 2/2016 | Chien et al. |
| 9,343,358 | B1 | 5/2016 | Xu |
| 9,397,093 | B2 | 7/2016 | Makala et al. |
| 2007/0029607 | A1 | 2/2007 | Kouznetzov |
| 2007/0210338 | A1 | 9/2007 | Orlowski |
| 2007/0252201 | A1 | 11/2007 | Kito et al. |
| 2008/0173928 | A1 | 7/2008 | Arai et al. |
| 2009/0242967 | A1 | 10/2009 | Katsumata et al. |
| 2009/0283819 | A1 | 11/2009 | Ishikawa et al. |
| 2009/0294828 | A1 | 12/2009 | Ozawa et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0171178 | A1 | 7/2010 | Goswami |
| 2010/0181610 | A1 | 7/2010 | Kim et al. |
| 2010/0207195 | A1 | 8/2010 | Fukuzumi et al. |
| 2010/0213527 | A1 | 8/2010 | Shim et al. |
| 2010/0320528 | A1 | 12/2010 | Jeong et al. |
| 2011/0033995 | A1 | 2/2011 | Katsumata et al. |
| 2011/0076819 | A1 | 3/2011 | Kim et al. |
| 2011/0133606 | A1 | 6/2011 | Yoshida et al. |
| 2011/0156044 | A1 | 6/2011 | Lee et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2012/0012921 | A1 | 1/2012 | Liu |
| 2012/0241846 | A1 | 9/2012 | Kawasaki et al. |
| 2012/0256247 | A1 | 10/2012 | Alsmeier |
| 2013/0237024 | A1 | 9/2013 | Alsmeier et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0175530 | A1 | 6/2014 | Chien et al. |
| 2014/0225181 | A1 | 8/2014 | Makala et al. |
| 2015/0044833 | A1 | 2/2015 | Lee et al. |
| 2015/0076584 | A1 | 3/2015 | Pachamuthu et al. |
| 2015/0179660 | A1 | 6/2015 | Yada et al. |
| 2015/0364488 | A1 | 12/2015 | Pachamuthu et al. |
| 2015/0380418 | A1 | 12/2015 | Zhang et al. |
| 2016/0071860 | A1 | 3/2016 | Kai et al. |
| 2016/0071861 | A1* | 3/2016 | Serov ............... H01L 27/11556 |
| | | | 365/185.19 |
| 2016/0071876 | A1 | 3/2016 | Mizuno et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, dated Jan. 17, 2012.
Invitation to Pay Additional Fees & Partial International Search Report, PCT/US2011/042566, dated Sep. 28, 2011.
International Search Report, International Application No. PCT/US2013/035567, dated Sep. 30, 2013, 6pgs.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Marks et al., "Plasma Etching of Cobalt Silicide", Legal Corporation, Petaluma, California—USA, Jan. 2003, 28 pgs.
K. Saraswat, "Polycides, Salicides and Metal Gates", Department of Electrical Engineering—Standford University, Standford—CA-USA, 24 pgs.
U.S. Appl. No. 14/687,403, filed Apr. 15, 2015, SanDisk Technologies Inc.
U.S. Appl. No. 14/808,229, filed Jul. 24, 2015, SanDisk Technologies Inc.

* cited by examiner

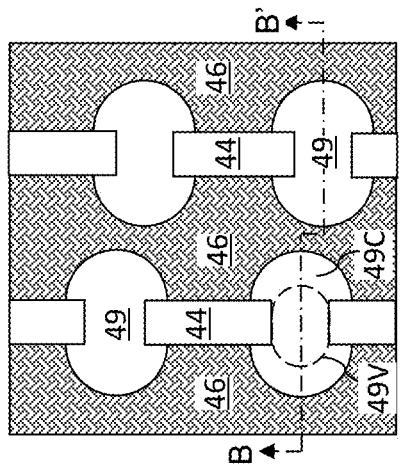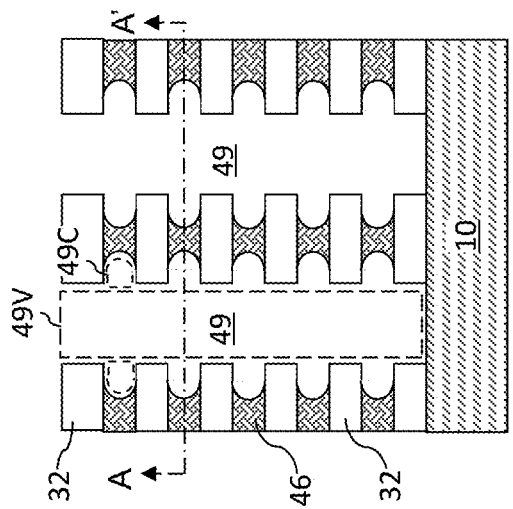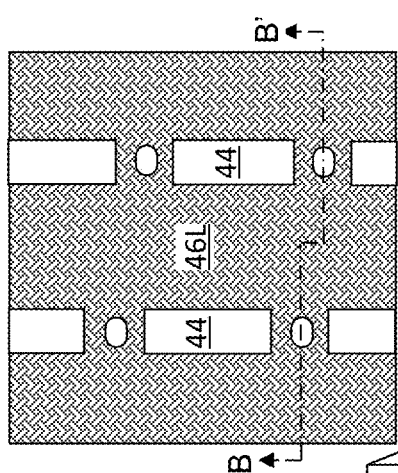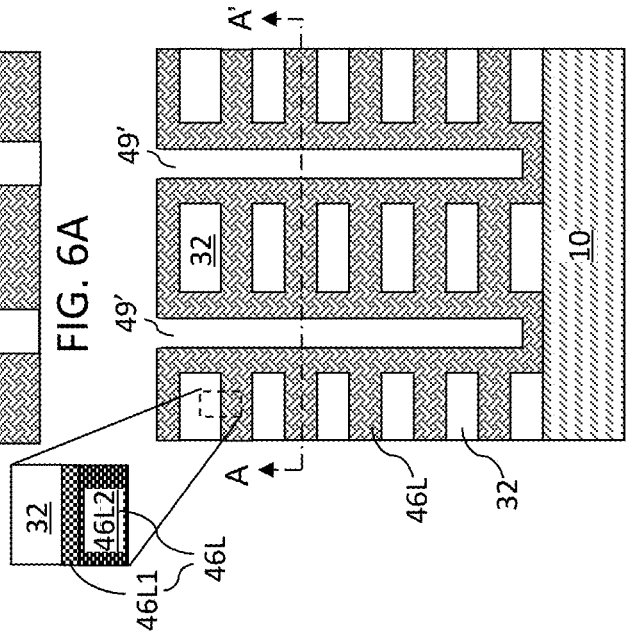

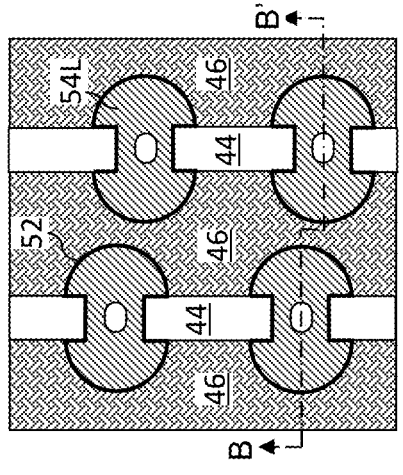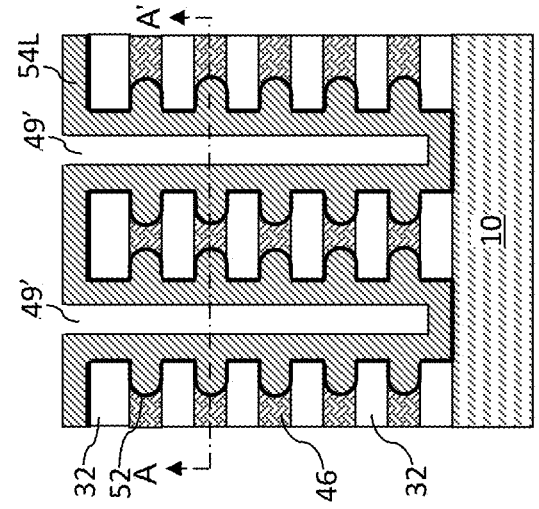
FIG. 8A  FIG. 8B
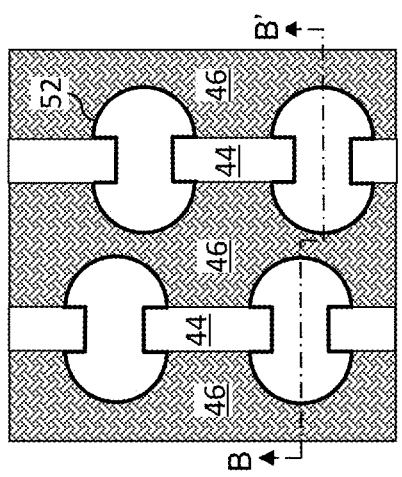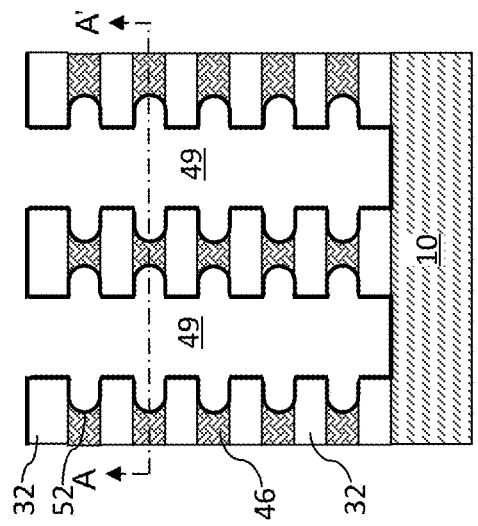
FIG. 9A  FIG. 9B

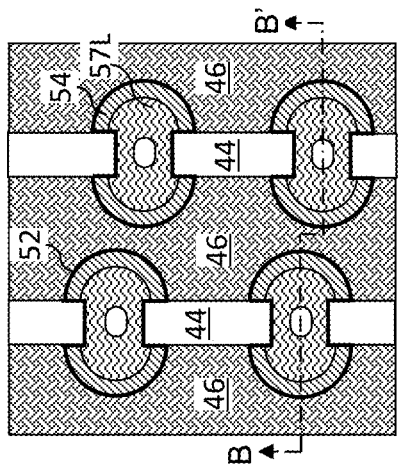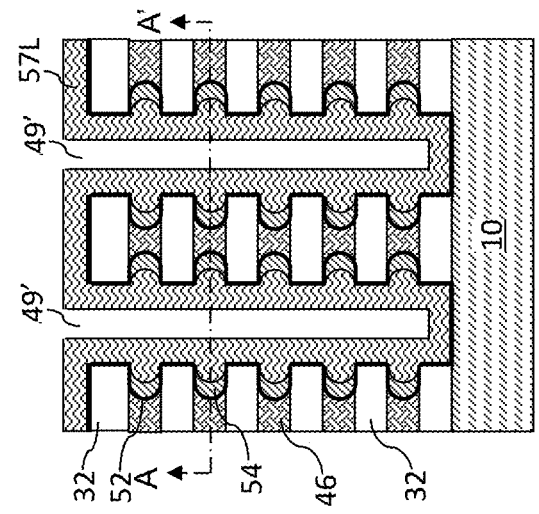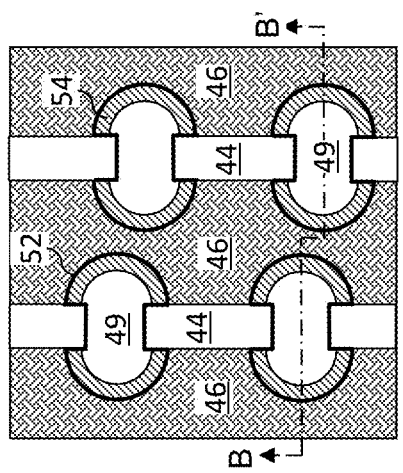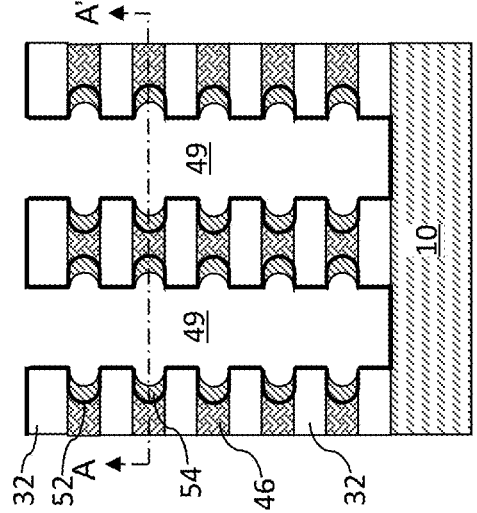
FIG. 11A
FIG. 11B
FIG. 10A
FIG. 10B

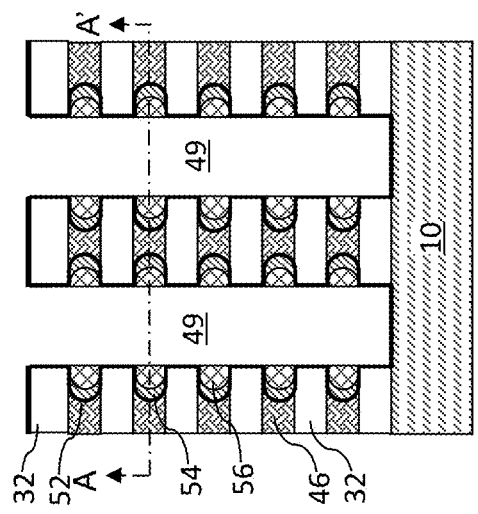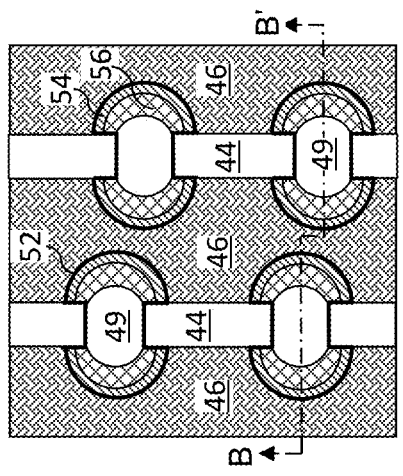
FIG. 13A  FIG. 13B
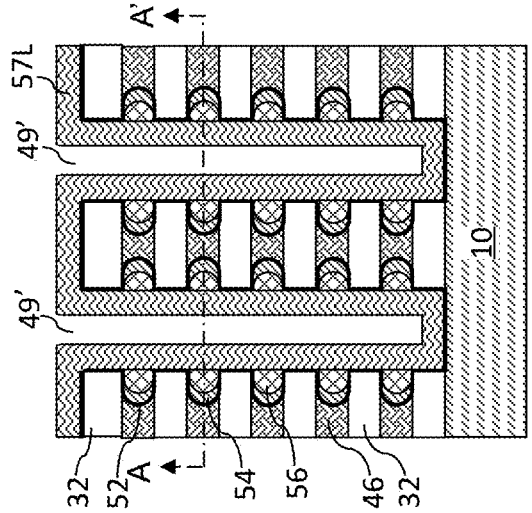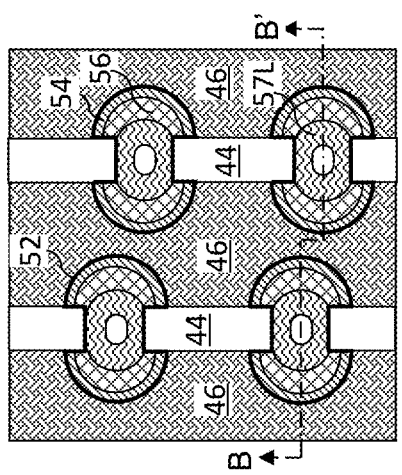
FIG. 12A  FIG. 12B

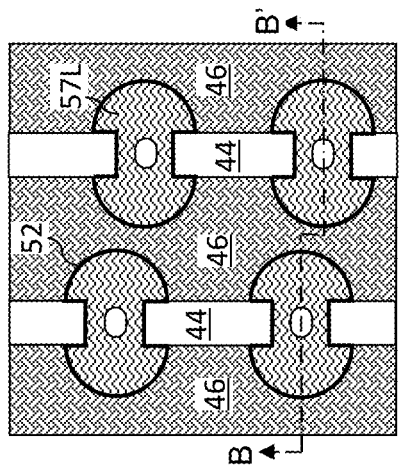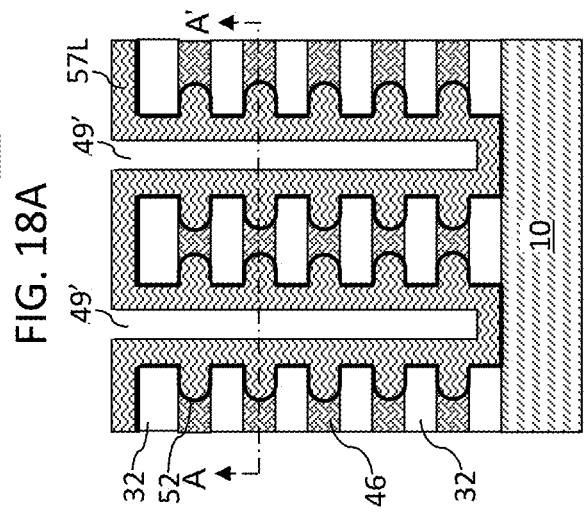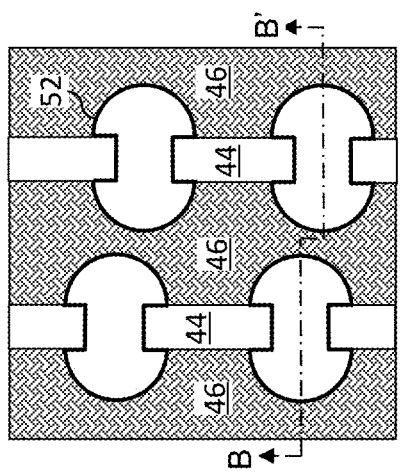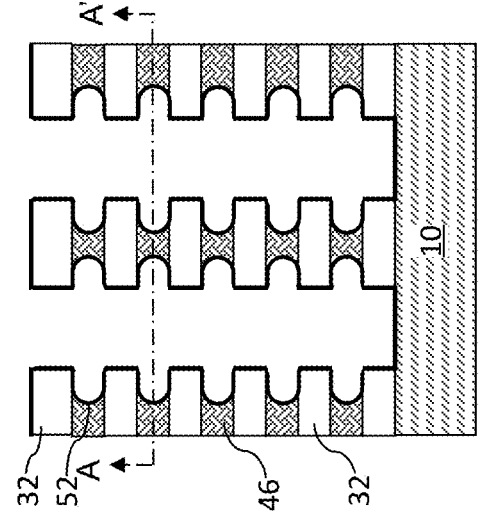

THREE-DIMENSIONAL MEMORY DEVICE WITH SEMICIRCULAR METAL-SEMICONDUCTOR ALLOY FLOATING GATE ELECTRODES AND METHODS OF MAKING THEREOF

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; memory openings vertically extending through the alternating stack, wherein each memory opening comprises a vertically extending volume of a substantially uniform horizontal cross-sectional area and pairs of lateral cavities physically spaced from each other and located around, and adjoined to, the vertically extending volume at each level of the electrically conductive layers; and dielectric separator structures vertically extending through the alternating stack and laterally extending between a respective neighboring pair of vertically extending volumes. Each lateral cavity among the pairs of lateral cavities includes a portion of a respective blocking dielectric layer and a respective metal-semiconductor alloy portion. Each vertically extending volume includes a respective tunneling dielectric layer and a respective semiconductor channel layer.

According to another aspect of the present disclosure, a method of forming a memory device is provided. A stack of alternating layers comprising insulating layers and spacer material layers is formed over a substrate. A dielectric separator structure is formed through the alternating stack. A plurality of memory openings is formed through the stack. The plurality of memory openings laterally separates the dielectric separator structure into a plurality of dielectric separator structures, and wherein the spacer material layers are formed as, or are replaced with, electrically conductive layers. Sidewalls of the electrically conductive layers are laterally recessed with respect to sidewalls of the insulating layers and sidewalls of the plurality of dielectric separator structures around each of the plurality of memory openings, wherein a pair of lateral cavities is formed at each level of the electrically conductive layers around each of the plurality of memory openings. A blocking dielectric layer is formed on the recessed sidewalls of the electrically conductive layers. A metal-semiconductor alloy portion is formed in each of the lateral cavities. A layer stack including a tunneling dielectric layer and a semiconductor channel layer is formed within each of the plurality of memory openings.

BRIEF DESCRIPTION OF THE DRAWINGS

FIG. 6A is a horizontal cross-sectional view of the first exemplary device structure after deposition of a conductive material layer according to the first embodiment of the present disclosure.

FIG. 6B is a vertical cross-sectional view of the first exemplary device structure along the vertical plane B-B' of FIG. 6A. The plane A-A' corresponds to the horizontal cross-sectional plane of FIG. 6A.

FIG. 7A is a horizontal cross-sectional view of the first exemplary device structure after formation of lateral cavities according to the first embodiment of the present disclosure.

FIG. 7B is a vertical cross-sectional view of the first exemplary device structure along the vertical plane B-B' of FIG. 7A. The plane A-A' corresponds to the horizontal cross-sectional plane of FIG. 7A.

FIG. 8A is a horizontal cross-sectional view of the first exemplary device structure after formation of a blocking dielectric layer according to the first embodiment of the present disclosure.

FIG. 8B is a vertical cross-sectional view of the first exemplary device structure along the vertical plane B-B' of FIG. 8A. The plane A-A' corresponds to the horizontal cross-sectional plane of FIG. 8A.

FIG. 9A is a horizontal cross-sectional view of the first exemplary device structure after deposition of a metal as a first material layer according to the first embodiment of the present disclosure.

FIG. 9B is a vertical cross-sectional view of the first exemplary device structure along the vertical plane B-B' of FIG. 9A. The plane A-A' corresponds to the horizontal cross-sectional plane of FIG. 9A.

FIG. 10A is a horizontal cross-sectional view of the first exemplary device structure after formation of metal portions by recessing the first material layer according to the first embodiment of the present disclosure.

FIG. 10B is a vertical cross-sectional view of the first exemplary device structure along the vertical plane B-B' of FIG. 10A. The plane A-A' corresponds to the horizontal cross-sectional plane of FIG. 10A.

FIG. 11A is a horizontal cross-sectional view of the first exemplary device structure after deposition of a semiconductor material as a second material layer according to the first embodiment of the present disclosure.

FIG. 11B is a vertical cross-sectional view of the first exemplary device structure along the vertical plane B-B' of FIG. 11A. The plane A-A' corresponds to the horizontal cross-sectional plane of FIG. 11A.

FIG. 12A is a horizontal cross-sectional view of the first exemplary device structure after formation of metal-semiconductor alloy portions through an anneal process according to the first embodiment of the present disclosure.

FIG. 12B is a vertical cross-sectional view of the first exemplary device structure along the vertical plane B-B' of FIG. 12A. The plane A-A' corresponds to the horizontal cross-sectional plane of FIG. 12A.

FIG. 13A is a horizontal cross-sectional view of the first exemplary device structure after removal of unreacted portions of the second material layer according to the first embodiment of the present disclosure.

FIG. 13B is a vertical cross-sectional view of the first exemplary device structure along the vertical plane B-B' of FIG. 13A. The plane A-A' corresponds to the horizontal cross-sectional plane of FIG. 13A.

FIG. 17A is a horizontal cross-sectional view of the third exemplary device structure after formation of a blocking dielectric layer according to the third embodiment of the present disclosure.

FIG. 17B is a vertical cross-sectional view of the third exemplary device structure along the vertical plane B-B' of FIG. 17A. The plane A-A' corresponds to the horizontal cross-sectional plane of FIG. 17A.

FIG. 18A is a horizontal cross-sectional view of the third exemplary device structure after deposition of a semiconductor material as a first material layer according to the third embodiment of the present disclosure.

FIG. 18B is a vertical cross-sectional view of the third exemplary device structure along the vertical plane B-B' of FIG. 18A. The plane A-A' corresponds to the horizontal cross-sectional plane of FIG. 18A.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
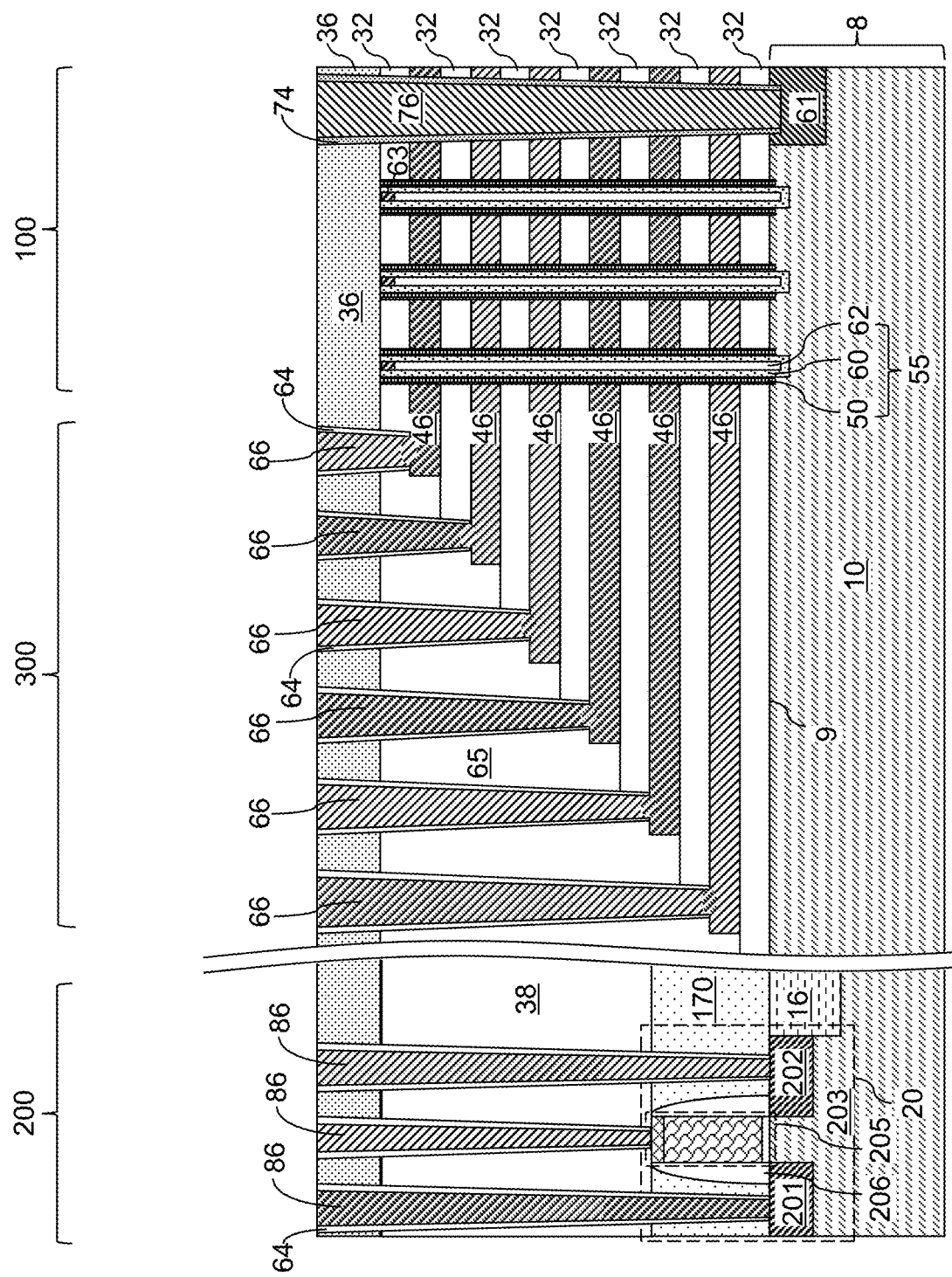
FIG. 1 is a vertical cross-section of an exemplary structure containing a 3D NAND stacked memory device according to an embodiment of the present disclosure.

Referring to FIG. 1, an exemplary structure according to embodiments of the present disclosure is shown, which includes a 3D NAND stacked memory device. The first exemplary structure can be employed to incorporate any of the various embodiments for forming memory stack structures 55 according to the present disclosure. Each memory stack structure 55 can include at least a memory film 50, a semiconductor channel 60, and optionally a dielectric core 62 in case the semiconductor channel 60 does not fill the entire volume within the memory film 50.

The exemplary structure includes a substrate 8, which can be a semiconductor substrate. Various semiconductor devices can be formed on, or over, the substrate 8 employing methods known in the art. For example, an array of memory devices can be formed in a device region 100, and at least one peripheral device 20 can be formed in a peripheral device region 200. Electrically conductive via contacts to the electrically conductive electrodes of the devices in the device region 100 can be formed in a contact region 300.

The substrate 8 can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface. In one embodiment, the substrate 8 is a silicon wafer containing a doped well (e.g., p-well) substrate semiconductor layer 10.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well substrate semiconductor layer 10 can be formed within the substrate 8.

Optionally, select gate electrodes (not shown) can be formed within, or on top of, the substrate semiconductor layer 10 using any suitable methods for implementing the array of vertical NAND strings. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference. A source region 61 can be formed in a region of the substrate semiconductor layer 10 that is laterally offset from the memory stack structures 55. Alternatively, a source region can be formed directly underneath memory stack structures 55 of memory cells, as described in U.S. patent application Ser. No. 14/317,274, filed on Jun. 27, 2014, which is incorporated herein by reference. A select transistor can be formed between the top of the substrate semiconductor layer 10 and the bottommost control gate of the memory devices.

At least one optional shallow trench isolation structure 16 and/or at least one deep trench isolation structure (not shown) may be employed to provide electrical isolation among various semiconductor devices on the substrate 8. The at least one peripheral device 20 formed in the peripheral device region 200 can include any device known in the art and needed to support the operation of the semiconductor devices in the device region 100. The at least one peripheral device 20 can include a driver circuit associated with the array of the memory devices in the device region 100. The at least one peripheral device can comprise transistor devices in the driver circuit. In one embodiment, the at least one peripheral device can include one or more field effect transistors, each of which can include a source region 201, a drain region 202, a body region 203 (e.g., a channel region), a gate stack 205, and a gate spacer 206. The gate stack 205 can include any type of gate stack known in the art. For example, each gate stack 205 can include, from one side to another, a gate dielectric, a gate electrode, and an optional gate cap dielectric. Optionally, a planarization dielectric layer 170 including a dielectric material may be employed in the peripheral device region 200 to facilitate planarization of the portion of material stacks to be subsequently formed on the substrate 8.

A stack of alternating layers of a first material and a second material different from the first material is formed over a top surface of the substrate 8. In one embodiment, the first material can be an insulator material that forms insulating layers 32, and the second material can be a conductive material that forms conductive line structures that can include electrically conductive layers 46, source-side select gate electrodes (not separately shown), and drain-side select gate electrodes (not separately shown). Alternatively, the first material can be an insulator material that forms insulating layers 32, and the second material can be a sacrificial material that is deposited as sacrificial layers, and is at least partly replaced with a conductive material to form various conductive line structures after formation of memory stack structures 55. In one embodiment, the alternating stack can include insulating layers 32 and material layers, which may comprise a sacrificial material that is subsequently replaced with a conductive material that forms control gate electrodes, or may comprise a conductive material that is patterned into control gate electrodes of a memory device.

The memory stack structures 55 can be formed through the alternating stack (32, 46) of the insulating layers 32 and the electrically conductive layers 46 employing the various methods of the present disclosure to be described below. A drain region 63 can be formed on top of each semiconductor channel 60. A peripheral region dielectric layer 64 can be formed by removing a peripheral portion of the alternating stack of insulating layers 32 and sacrificial material layers 42 (shown in FIG. 2B and described below) from a peripheral device region 200 including the peripheral devices (such as driver circuits) and depositing a dielectric material over the planarization dielectric layer 170. Another portion of the alternating stack (32, 42 or 46) in a contact region 300 can be removed to form stepped surfaces in which the lateral extent of the material layers (such as sacrificial material layers 42 or electrically conductive layers 46) decreases with the vertical distance from the substrate 8. A retro-stepped dielectric fill portion 65 may be optionally employed over the stepped surfaces. As used herein, a retro-stepped structure refers to a structure in which the horizontal vertical cross-sectional area changes stepwise with a vertical distance from a top surface of a substrate such that a vertical cross-sectional area of the structure at a lower horizontal plane is included in vertical cross-sectional areas of the structure at an overlying horizontal plane. Another portion 38 of the dielectric fill may be formed in region 200 at the same time as the portion 65 is formed in region 300.

A contact via trench is formed through the alternating stack (32, 42) at locations of a backside contact via structure 76 to be subsequently formed. If the material layers between vertically neighboring pairs of insulating layers 32 are sacrificial material layers 42, then the sacrificial material layers 42 can be removed by introducing an etchant through the contact via trench. The etchant removes the material of the sacrificial material layers 42 selective to the material of the insulating layers 32 to form backside recesses. Electrically conductive layers 46 can be formed by depositing at least one conducive material in the backside recesses. The electrically conductive layers 46 include control gate electrodes for the memory stack structures 55. The electrically conductive layers 46 can form terraced (stepped) structures within the contact region 300 in order to facilitate formation of contact via structures 66.

The contact via structures 66 can be formed by forming via cavities that extend to the stepped surfaces of the electrically conductive layers 46, and by filling each via cavity with an optional dielectric liner 64 and a contact via structure 66. The dielectric liner 64, if present, may enhance electrical isolation of the contact via structures 66. A hard mask layer 36 may be optionally employed to facilitate formation of the contact via structures 66. Peripheral contact via structures 86 can be formed in the peripheral device region 200. A backside contact via structure 76 (e.g., source electrode/source local interconnect) can be formed through the alternating stack (32, 46) to provide electrical contact to the source region 61. A dielectric spacer 74 can be employed to provide electrical isolation for the backside contact via structure 76. Subsequently, contacts (not shown) to the drain regions 63 can be formed, and bit lines (not shown) that overlie, and electrically shorted to, the drain regions 63 can be formed.

Figure 2A:
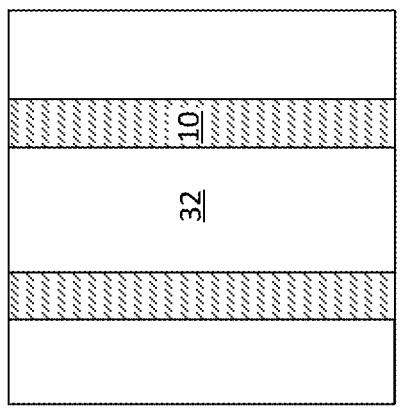
FIG. 2A is a top-down view a first exemplary device structure that can be incorporated into an array region of the exemplary structure of FIG. 1 after formation of laterally-extending trenches according to a first embodiment of the present disclosure.
Figure 2B:
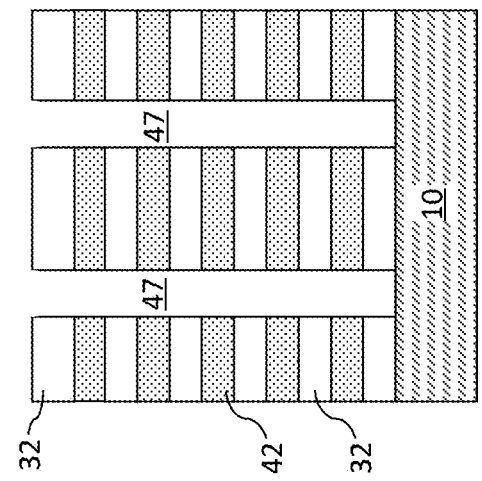
FIG. 2B is a vertical cross-sectional view of the first exemplary device structure of FIG. 2A.

Referring to FIGS. 2A and 2B, a cut-out portion of a memory region 100 (e.g., memory array region) is illustrated for a first exemplary device structure during a processing step employed to form the exemplary structure of FIG. 1 according to an embodiment of the present disclosure. Specifically, an alternating stack (32, 42) of insulating layers 32 and sacrificial material layers 42 is formed over a substrate 8.

Electrically insulating materials that can be employed for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. The sacrificial material layers 42 comprise sacrificial layers, such as silicon nitride or polysilicon sacrificial layers. In an illustrative example, the insulating layers 32 can include silicon oxide and the sacrificial material layers 42 can be silicon nitride layers that can be subsequently removed, for example, by a wet etch employing phosphoric acid.

Separator trenches 47 can be optionally formed through the alternating stack (32, 42) of insulating layers 32 and sacrificial material layers 42. The separator trenches 47 can be formed, for example, by application and patterning of a photoresist layer over the alternating stack (32, 42), and transfer of the pattern in the patterned photoresist layer through the alternating stack (32, 42) to the top surface of the substrate 8 that is located at the bottom of the alternating stack (32, 42). The separator trenches 47 laterally extend along a horizontal direction. In one embodiment, the separator trenches 47 can have a substantially uniform width, and can be parallel among one another. The separator trenches 47 can laterally divide the alternating stack (32, 42) into a plurality of portions. The pattern of the separator trenches 47 can be the same as the pattern of the dielectric separator structures to be subsequently formed. The width of the separator trenches 47 can be less than the maximum lateral dimension (such as the diameter of the major axis) of a horizontal cross-sectional shape of memory opening to be subsequently formed. In one embodiment, the width of each separator trench 47 can be in a range from 30 nm to 300 nm, although lesser and greater widths can also be employed.

Figure 3A:
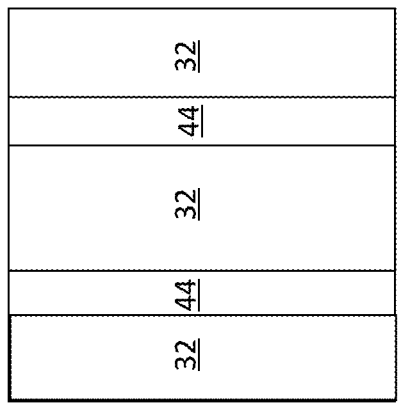
FIG. 3A is a top-down view of the array region illustrating the first exemplary device structure after formation of dielectric separator structures according to the first embodiment of the present disclosure.
Figure 3B:
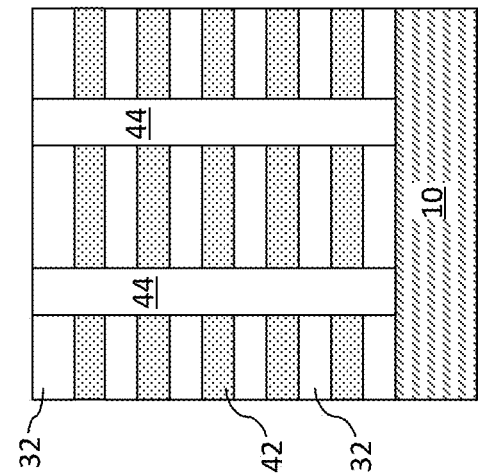
FIG. 3B is a vertical cross-sectional view of the first exemplary device structure of FIG. 3A.

Referring to FIGS. 3A and 3B, each separator trench 47 can be filled with a dielectric material that is different from the second material of the sacrificial layers 42. The dielectric material that fills the separator trenches 47 is herein referred to as a separator insulating material. For example, the separator insulating material can be undoped silicate glass or doped silicate glass when sacrificial layers comprise silicon nitride. The separator insulating material can be deposited by a conformal deposition process and/or be reflowed after deposition to avoid formation of seams. Excess portions of the separator insulating material can be removed from above the top surface of the alternating stack, for example, by chemical mechanical planarization (CMP), a recess etch, or a combination thereof. Remaining portions of the deposited separator insulating material constitutes dielectric separator structures 44. In one embodiment, the dielectric separator structures 44 can laterally separate various portions of the alternating stack (32, 42). The dielectric separator structures 44 can have a substantially uniform width throughout, and can include straight portions. In one embodiment, a plurality of dielectric spacer structures 44 can laterally extend along a same horizontal direction.

Figure 4A:
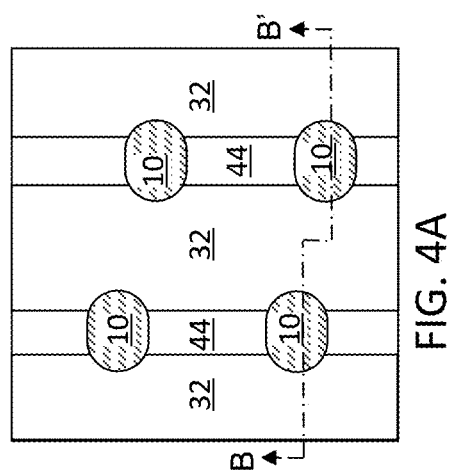
FIG. 4A is a top-down view of the first exemplary device structure after formation of memory openings according to the first embodiment of the present disclosure.
Figure 4B:
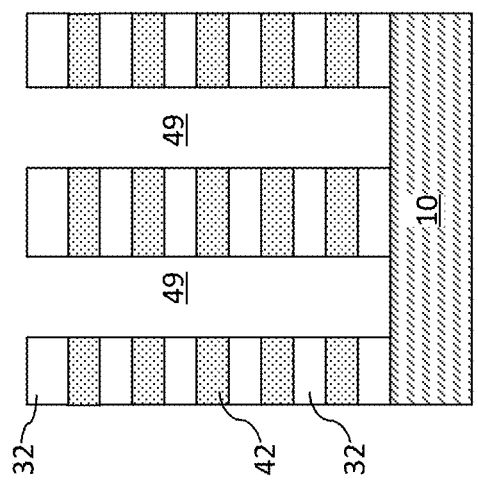
FIG. 4B is a vertical cross-sectional view of the first exemplary device structure along the vertical plane B-B' of FIG. 4A.

Referring to FIGS. 4A and 4B, memory openings 49 can be formed through the alternating stack (32, 42). The memory openings 49 can be formed, for example, by application of a masking layer over the alternating stack (32, 42), patterning of the masking layer, and transfer of the pattern in the masking layer through the alternating stack (32, 42) by an anisotropic etch such as a reactive ion etch. The masking layer can include a photoresist layer and optionally include an additional hard mask material layer such as a carbon layer. The masking layer can be subsequently removed, for example, by ashing. A plurality of memory openings 49 are formed through the alternating stack (32, 42), and laterally separates the dielectric separator structure 44 into a plurality of dielectric separator structures 44. Each memory opening 49 can vertically extend from the top surface of the alternating stack (32, 42) to the top surface of the substrate that is located at the bottom of the alternating stack (32, 42). Each memory opening 49 can be located between a pair of dielectric separator structures 44, which are remaining portions of the dielectric separator structures as formed at the step of FIGS. 3A and 3B. In one embodiment, each memory opening 49 can divide a dielectric separator structure 44 into two physically disjoined portions. In this case, each memory opening 49 in the alternating stack (32, 42) can extend through the separator insulating material located in the dielectric separator structures 44, and divides a dielectric separator structure 44 into two laterally disjoined portions. Optionally, an epitaxial channel portion (not shown) may be formed directly on the physically exposed semiconductor surface of the substrate semiconductor layer 10 at the bottom of each memory opening 49 after the processing steps of FIGS. 4A and 4B.

Figure 5A:
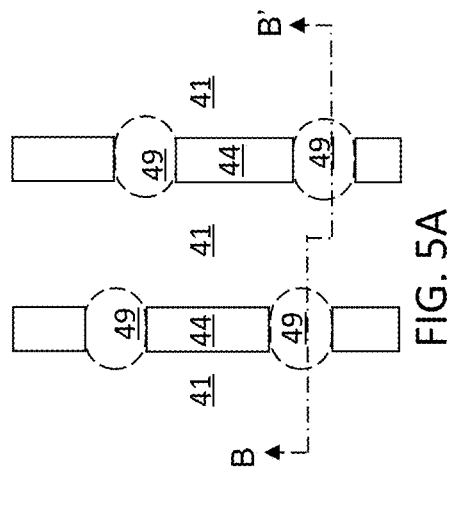
FIG. 5A is a horizontal cross-sectional view of the first exemplary device structure after removal of sacrificial material layers according to the first embodiment of the present disclosure.
Figure 5B:
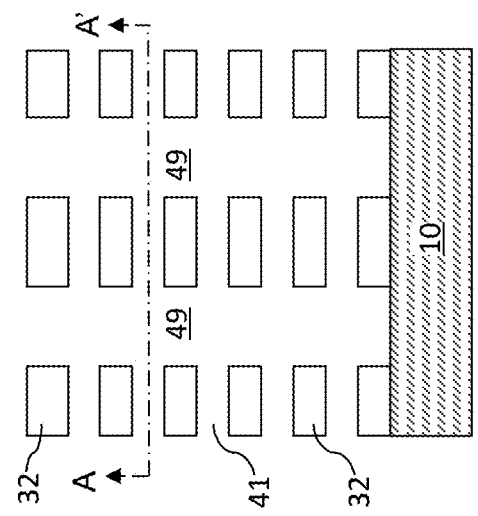
FIG. 5B is a vertical cross-sectional view of the first exemplary device structure along the vertical plane B-B' of FIG. 5A. The plane A-A' corresponds to the horizontal cross-sectional plane of FIG. 5A.

Referring to FIGS. 5A and 5B, an etchant that selectively etches the second material of the sacrificial material layers 42 with respect to the first material of the insulating layers 32 can be introduced into the memory openings 49, for example, employing an etch process. Interlayer voids 41 (e.g., lateral recesses) are formed in volumes from which the sacrificial material layers 42 are removed. The removal of the second material of the sacrificial material layers 42 can be selective to the first material of the insulating layers 32, the material of the dielectric separator structures 44, and the semiconductor material of the semiconductor material layer 10. In one embodiment, the sacrificial material layers 42 can include silicon nitride, and the materials of the insulating layers 32 and the dielectric separator structures 44 can be selected from silicon oxide and dielectric metal oxides. In this case, hot phosphoric acid can be employed as the etchant. In another embodiment, the sacrificial material layers 42 can include a semiconductor material such as polysilicon, germanium, or a silicon-germanium alloy, and the materials of the insulating layers 32 and the dielectric separator structures 44 can be selected from silicon oxide, silicon nitride, and dielectric metal oxides. In this case, a KOH solution and optional hydrogen peroxide can be employed as the etchant.

Referring to FIGS. 6A and 6B, at least one conductive material layer 46L is deposited by a conformal deposition method. The at least one conductive material layer 46L can include a single conductive material layer or a plurality of conductive material layers. For example, the at least one conductive material layer 46L can include a metallic liner layer 46L1 and a metallic fill material layer 46L2, which can be sequentially deposited to completely fill the interlayer voids 41.

In one embodiment, the metallic liner layer 46L1 can include a conductive material, which can be, for example, a conductive barrier material. In one embodiment, the conductive liner layer 46L1 can include a material such as a conductive metal nitride (e.g., TiN, TaN, or WN), a conductive metal carbide (TiC, TaC, or WC), and a stack including at least one conductive metal nitride and at least one conductive metal carbide. In one embodiment, the conductive liner layer 46L1 can comprise TiN. The thickness of the metallic liner layer 46L1 can be in a range from 1.5 nm to 6 nm, although lesser and greater thicknesses can also be employed.

The metallic fill material layer 46L2 includes a conductive material such as at least one metal. For example, the metallic fill material layer 46L2 can include at least a first metal such as tungsten, cobalt, ruthenium, copper, nickel, titanium, tantalum, and combinations thereof. The metallic fill material layer 46L2 may include an elemental metal (i.e., the first metal in an elemental form without combining with another metal or a non-metallic element), or may include an alloy of at least two metallic elements (which include the first metal and at least another metal). In one embodiment, the metallic fill material layer 46L2 can include tungsten. The metallic fill material layer 46L2 can completely fill remaining volumes of the lateral recesses, and partially fills each memory opening. Because the memory openings 49 are not completely filled with the at least one conductive material layer (46L1, 46L2), a vertical cavity 49' is present within each memory opening 49.

Referring to FIGS. 7A and 7B, at least one etch process can be performed to remove portions of the at least one conductive material layer 46L from inside the memory openings 49 and from above the alternating stack (32, 46). The at least one etch process can include an isotropic etch process, an anisotropic etch process, or a combination of an anisotropic etch process and an isotropic etch process. In an illustrative example, an isotropic etch process can be performed to remove vertical portions of the at least one conductive material layer 46L from inside the memory openings 49 and to remove horizontal portions of the at least one conductive material layer 46L from above the alternating stack (32, 46). In an illustrative example, if the at least one conductive material layer 46L includes tungsten, a wet etch employing hydrofluoric acid, nitric acid, hydrogen peroxide, hydrochloric acid, and/or sulfuric acid can be employed to isotropically etch the at least one conductive material layer 46L. Remaining portions of the at least one conductive material layer 46L constitute electrically conductive layers 46, each of which is located between a vertically neighboring pair of insulating layers 32 and fills a volume of an interlayer void 41. Each remaining portion of the metallic liner layer 46L1 at a level of an interlayer void 41 is herein referred to as a metallic liner, and each remaining portion of the metallic fill material layer 46L2 within an interlayer void 41 is herein referred to as a metallic fill material portion.

After removal of the vertical portions of the at least one conductive material layer 46L in the memory openings 49 and the horizontal portions of the at least one conductive material layer 46L from above the alternating stack (32, 46), sidewalls of the electrically conductive layers 46 are laterally recessed with respect to sidewalls of the insulating layers 32 and sidewalls of the plurality of dielectric separator structures 44 around each of the plurality of memory openings 49. The lateral recessing of the sidewalls of the electrically conductive layers 46 can be performed, for example, by another isotropic etch process or by prolonging a prior isotropic etch process (employed to remove the vertical portions of the at least one conductive material layer 46L in the memory openings 49 and the horizontal portions of the at least one conductive material layer 46L from above the alternating stack (32, 46)). A pair of lateral cavities 49C is formed at each level of the electrically conductive layers 46 around each of the plurality of memory openings 49. Each cavity within a pair of lateral cavities 49C can be laterally separated from each other by a pair of dielectric separator structures 44.

Upon laterally recessing the sidewalls of the electrically conductive layers 46 and formation of pairs of lateral cavities 49C, each memory opening 49 includes a vertically extending volume 49V and pairs of lateral cavities 49C. In one embodiment, the vertically extending volume 49V can be of a substantially uniform horizontal cross-sectional area, i.e., can have a horizontal cross-sectional area that does not substantially change with height. In one embodiment, each pair of lateral cavities 49C in a memory opening 49 can be physically spaced from each other. In one embodiment, the vertically extending volume 49V can be laterally bounded by vertically coincident sidewalls of the insulating layers 32. Each pair of lateral cavities 49C can be located at a level of a respective electrically conductive layer 46, and can be adjoined to, and located around, the vertically extending volume 49V. Each pair of lateral cavities 49C can be laterally bounded by sidewalls of the dielectric separator structures 44.

In one embodiment, the recessed sidewalls of the electrically conductive layers 46 can be concave sidewalls. In this case, the lateral cavities 49C can be laterally bounded by respective concave sidewalls of the electrically conductive layers 46 and substantially vertical sidewalls of the dielectric separator structures 44, and can be adjoined to the vertically extending volume 49V. The concave sidewalls can be caused by limited diffusion of the etchant into the lateral cavities 49C during the isotropic etch.

Referring to FIGS. 8A and 8B, a blocking dielectric layer 52 can be formed on the physically exposed sidewalls of the electrically conductive layers 46 and the insulating layers 32 around each memory opening 49 and over the alternating stack (32, 46). The blocking dielectric layer 52 can be a single blocking dielectric layer or a plurality of blocking dielectric layers including different materials. In one embodiment, the blocking dielectric layer 52 can include a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The blocking dielectric layer 52 can be deposited, for example, by chemical vapor deposition (CVD), atomic layer deposition (ALD), pulsed laser deposition (PLD), liquid source misted chemical deposition, or a combination thereof. The blocking dielectric layer 52 can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include silicon oxide, another dielectric metal oxide material, silicon oxynitride, silicon nitride, or a combination thereof. In one embodiment, the blocking dielectric layer 52 can include a layer stack, from outside to inside, of an aluminum oxide layer and a silicon oxide layer. The blocking dielectric layer 52 can be formed by at least one conformal deposition process (such as chemical vapor deposition or atomic layer deposition). The blocking dielectric layer 52 is deposited as a continuous material layer. The thickness of the blocking dielectric layer 52 can be in a range from 1 nm to 20 nm, although lesser and greater thicknesses can also be employed.

Referring to FIGS. 9A and 9B, a first material layer can be deposited on the blocking dielectric layer 52 to fill the lateral cavities 49C. The first material layer includes a first material, and is deposited as a continuous material layer over the blocking dielectric layer 52. The thickness of the first material layer is selected such that the entirety of each lateral cavity 49C is filled by the first material layer. The first material layer can be deposited by a conformal deposition method such as chemical vapor deposition or atomic layer deposition. The first material layer includes vertical portions covering sidewalls of the memory openings 49, lower horizontal portions located at the bottom of each memory opening 49, and an upper horizontal portion located above the alternating stack (32, 46). A vertical cavity 49' is formed at a center portion of each memory opening 49.

In one embodiment, the first material layer can be a metal layer 54L including at least one metal that forms a metal-semiconductor alloy, such as a silicide or germanide. For example, the metal layer 54L can include one or more of nickel, titanium, cobalt, tungsten, molybdenum, tantalum and platinum. The metal layer 54L can consist essentially of a single elemental metal, or can include an intermetallic alloy of at least two elemental metals.

Referring to FIGS. 10A and 10B, an isotropic or anisotropic etch process, such as a reactive ion etch process (RIE) can be performed to remove a horizontal portion of the metal layer 54L from above the alternating stack (32, 46), and portions of the metal layer 54L within each vertically extending volume 49V of the memory openings 49. The chemistry of the etch can be selected to remove the first material of the metal layer 54L selective to the material of the blocking dielectric layer 52. After removal of the first material of the metal layer 54L from within the vertically extending volume 49V of each memory opening 49, the etch proceeds further so that the first material is laterally recessed at the levels of the electrically conductive layers 46. The duration of the etch can be selected so that a remaining portion of the first material of the metal layer 54L is present within each lateral cavity 49C inside the concave sidewalls of the blocking dielectric layer 52 at each level of the electrically conductive layers 46. A discrete remaining portion of the metal layer 54L is present within each volume of the lateral cavities 49C, and constitute a respective metal portion 54. The maximum lateral thickness of each metal portion 54 can be in a range from 1 nm to 10 nm, although lesser and greater maximum lateral thicknesses can also be employed. The metal portions 54 can have a concave side surface facing the memory opening 49 and leave a portion of the lateral cavities 49C adjacent to the volume 49V unfilled.

Referring to FIGS. 11A and 11B, a second material layer can be deposited on the discrete portions of the first material, which are embodied as the metal portions 54, to fill remaining volumes of the lateral cavities 49C. The second material layer includes a second material, and is deposited as a continuous material layer over the metal portions 54 and the blocking dielectric layer 52. The thickness of the second material layer is selected such that the entirety of each remaining volume of the lateral cavities 49C is filled by the second material layer. The second material layer can be deposited by a conformal deposition method such as chemical vapor deposition or atomic layer deposition. The second material layer includes vertical portions covering sidewalls of the memory openings 49, lower horizontal portions located at the bottom of each memory opening 49, and an upper horizontal portion located above the alternating stack (32, 46). A vertical cavity 49' is formed at a center portion of each memory opening 49.

In one embodiment, the second material layer can be a semiconductor material layer 57L including at least one semiconductor material. The semiconductor material layer 57L includes a semiconductor material that forms a metal-semiconductor alloy with the first material, i.e., the metal, of the metal portions 54. For example, the semiconductor material layer 57L can include silicon, germanium, a silicon-containing semiconductor alloy (such as a silicon-germanium alloy or a silicon-germanium-carbon alloy), or a germanium-containing semiconductor alloy. In one embodiment, the semiconductor material layer 57L can include amorphous silicon or polycrystalline silicon.

Referring to FIGS. 12A and 12B, an anneal process is performed at an elevated temperature to induce formation of a metal-semiconductor alloy through reaction of the first material (i.e., at least one metal) in the metal portions 54 and the second material (i.e., a semiconductor material) in the semiconductor material layer 57L. The elevated temperature can be in a range from 500 degrees Celsius to 900 degrees Celsius depending on the materials of the metal portions 54 and the semiconductor material layer 57L. The duration of the anneal process can be in a range from 10 seconds (e.g., using rapid thermal annealing) to 1 hour, although shorter and longer durations can also be employed. Generally speaking, the greater the melting temperature of the elemental metal(s) in the metal portions 54, the higher the elevated temperature and/or the longer the duration of the anneal process.

A metal-semiconductor alloy portion 56 is formed within each volume of the lateral cavities 49C. For example, if the semiconductor is silicon, then the metal-semiconductor alloy portion 56 comprises at least one of nickel, titanium, cobalt, tungsten, molybdenum, tantalum and platinum silicide. If the semiconductor is germanium, then the metal-semiconductor alloy portion 56 comprises at least one of nickel, titanium, cobalt, tungsten, molybdenum, tantalum and platinum germanide. In one embodiment, the temperature and duration of the anneal process can be selected so that a fraction of each portion of the first material (i.e., a fraction of each metal portion 54) does not react with the second material of the semiconductor material layer 57L during formation of the metal-semiconductor alloy portions 56. A respective remaining metal portion 54, which is a first material portion, is present within each volume of the lateral cavities 49C after the anneal process.

A pair of physically disjoined (i.e., non-contacting) metal-semiconductor alloy portions 56 can be formed within each pair of lateral cavities 49C within a memory opening 49. In one embodiment, the temperature and duration of the anneal process can be selected such that the interface between a metal-semiconductor alloy portion 56 and a remaining unreacted portion of the semiconductor material layer 57L is substantially vertically coincident with sidewalls of the insulating layers 32 around a respective memory opening 49.

Referring to FIGS. 13A and 13B, unreacted portions of the semiconductor material layer 57L can be removed selective to the metal-semiconductor alloy portions 56 and optionally selective to the blocking dielectric layer 52. For example, if the semiconductor material layer 57L includes silicon, a wet etch employing KOH or a combination of nitric acid and ammonium hydroxide can be employed to remove the second material of the semiconductor material layer 57L selective to the metal-semiconductor alloy portions 56 and the blocking dielectric layer 52. The amount of deposited material in the lateral cavities 49C, the temperature of the anneal for forming a metal silicide, and removal of unreacted material after the silicide formation process can be controlled to eliminate and/or minimize formation of bumps and/or dimples on the sidewalls of the metal-semiconductor alloy portions 56. Thus, the inner sidewalls of the metal-semiconductor alloy portions 56 can have substantially vertical surfaces. For example, the lateral protrusion or recessing of the sidewalls of the metal-semiconductor alloy portions 56 from the inner sidewalls of the blocking dielectric layer 52 may be less than the thickness of the blocking dielectric layer 52. For example, 1 nm of tungsten and 2.53 nm of polysilicon can be reacted to form 2.58 nm of cobalt silicide. In another example, 1 nm of cobalt and 3.64 nm of polysilicon can be reacted to form to form 3.52 nm of cobalt silicide. Thus, an 11.8 nm thick polysilicon layer can be formed in the later cavities 49C that are 30 nm deep (in the horizontal direction) and 30 nm high (in the vertical direction). This leaves an 18.2 nm deep and 5.4 nm high cavity in the polysilicon layer. A 3 nm thick cobalt layer can be formed on the polysilicon layer to completely fill the cavity in the polysilicon layer. The device is then annealed to react the polysilicon and cobalt layers to form cobalt silicide portions 56 which fill the lateral cavities 49C. After removing the remaining unreacted cobalt layer by selective etching, the cobalt silicide portions 56 have substantially vertical surfaces.

Figure 14A:
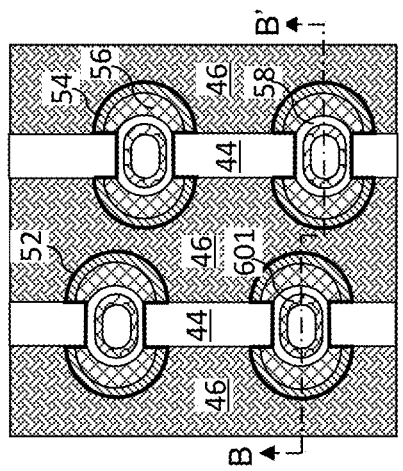
FIG. 14A is a horizontal cross-sectional view of the first exemplary device structure after formation of a tunneling dielectric layer and a first semiconductor material layer in each memory opening according to the first embodiment of the present disclosure.
Figure 14B:
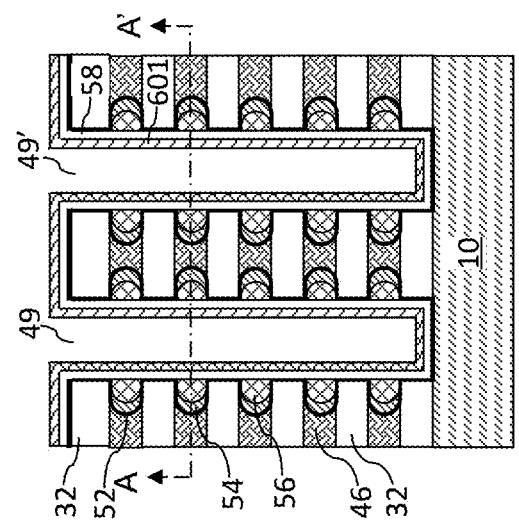
FIG. 14B is a vertical cross-sectional view of the first exemplary device structure along the vertical plane B-B' of FIG. 14A. The plane A-A' corresponds to the horizontal cross-sectional plane of FIG. 14A.

Referring to FIGS. 14A and 14B, a tunneling dielectric layer 58 is formed as a continuous material layer on the physically exposed surfaces of the metal-semiconductor alloy portions 56 and the blocking dielectric layer 52. The tunneling dielectric layer 58 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 58 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 58 can include a stack of a first silicon oxide layer, a silicon oxynitride layer, and a second silicon oxide layer, which is commonly known as an ONO stack. In one embodiment, the tunneling dielectric layer 58 can include a silicon oxide layer that is substantially free of carbon or a silicon oxynitride layer that is substantially free of carbon. The thickness of the tunneling dielectric layer 58 can be in a range from 2 nm to 20 nm, although lesser and greater thicknesses can also be employed. The tunneling dielectric layer 58 can be formed directly on an inner sidewall of the blocking dielectric layer 52 at each level of the insulating layers 32, and can be laterally spaced from the blocking dielectric layer 32 at each level of the electrically conductive layers 46.

An optional first semiconductor channel layer 601 can be deposited on the tunneling dielectric layer 58. The first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A vertical cavity 49' is formed in the volume of each memory opening 49 that is not filled with the deposited material portions (52, 54, 56, 58, 601).

Figure 15A:
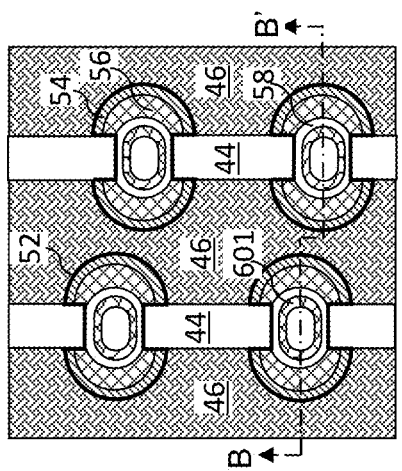
FIG. 15A is a horizontal cross-sectional view of the first exemplary device structure after formation of a dielectric core and a drain region in each memory opening according to the first embodiment of the present disclosure.
Figure 15B:
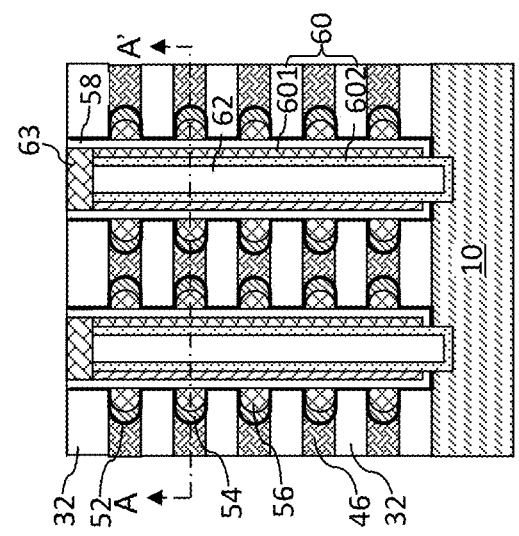
FIG. 15B is a vertical cross-sectional view of the first exemplary device structure along the vertical plane B-B' of FIG. 15A. The plane A-A' corresponds to the horizontal cross-sectional plane of FIG. 15A.

Referring to FIGS. 15A and 15B, the optional first semiconductor channel layer 601, the tunneling dielectric layer 58, and the blocking dielectric layer 52 are sequentially anisotropically etched employing at least one anisotropic etch process. The portions of the first semiconductor channel layer 601, the tunneling dielectric layer 58, and the blocking dielectric layer 52 located above the top surface of the alternating stack (32, 46) can be removed by the at least one anisotropic etch process. Further, the horizontal portions of the first semiconductor channel layer 601, the tunneling dielectric layer 58, and the blocking dielectric layer 52 at a bottom of each vertical cavity 49' can be removed to form openings therethrough.

A surface of the substrate semiconductor layer 10 (or an epitaxial channel portion in case epitaxial channel portions are formed by a selective epitaxy process after the processing steps of FIGS. 4A and 4B) can be physically exposed underneath the opening through the first semiconductor channel layer 601, the tunneling dielectric layer 58, and the blocking dielectric layer 52 at a bottom portion of each memory opening 49. Optionally, the physically exposed semiconductor surface at the bottom of each vertical cavity 49' can be vertically recessed.

In one embodiment, the first semiconductor channel layer 601, the tunneling dielectric layer 58, and the blocking dielectric layer 52 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

A second semiconductor channel layer 602 can be deposited directly on the semiconductor surface of the substrate semiconductor layer 10 (of a respective epitaxial channel portion if provided), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

In case the vertical cavity 49' in each memory opening 49 is not completely filled by the second semiconductor channel layer 602, a dielectric core layer can be deposited in each vertical cavity 49' to fill any remaining portion of the vertical cavities 49'. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. Horizontal portion of the dielectric core layer can be removed, for example, by a recess etch from above the top surface of the alternating stack (32, 46). Each remaining portion of the dielectric core layer constitutes a dielectric core 62. Further, the horizontal portion of the second semiconductor channel layer 602 located above the top surface of the alternating stack (32, 46) can be removed by a planarization process, which can employ a recess etch or chemical mechanical planarization (CMP).

Each adjoining pair of a first semiconductor channel layer 601 and a second semiconductor channel layer 602 can collectively form a semiconductor channel 60 through which electrical current can flow when a vertical NAND device including the semiconductor channel 60 is turned on. A tunneling dielectric layer 58 laterally surrounds the semiconductor channel 60. Each adjoining combination of a metal portion 54 and a metal-semiconductor alloy portion 56 constitutes a floating gate electrode (54, 56). A pair of floating gate electrodes (54, 56) is provided within each pair of lateral cavities in a memory opening 49. A layer stack (58, 60) including a tunneling dielectric layer 58 and a semiconductor channel 60 is provided within each of the plurality of memory openings 49. Each contiguous set of an optional dielectric core 62, a semiconductor channel 60, a tunneling dielectric layer 58, floating gate electrodes (54, 56) contacting the tunneling dielectric layer 58, and a blocking dielectric layer 52 collectively constitutes a memory stack structure (62, 60, 58, 56, 54, 52). Each memory opening 49 includes a respective memory stack structure (62, 60, 58, 56,

54, 52), which can be incorporated as an instance of the memory stack structure 55 into the exemplary structure of FIG. 1.

The top surface of each dielectric core 62 can be further recessed within each memory opening, for example, by a recess etch to a depth that is located between the top surface of the alternating stack (32, 46) and the bottom surface of the alternating stack (32, 46). Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the alternating stack (32, 46), for example, by chemical mechanical planarization (CMP) or a recess etch to form the drain regions 63.

Figure 16A:
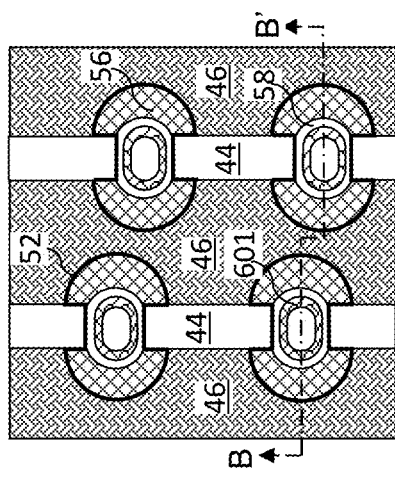
FIG. 16A is a vertical cross-sectional view of a second exemplary device structure that can be incorporated into an array region of the exemplary structure of FIG. 1 according to a second embodiment of the present disclosure.
Figure 16B:
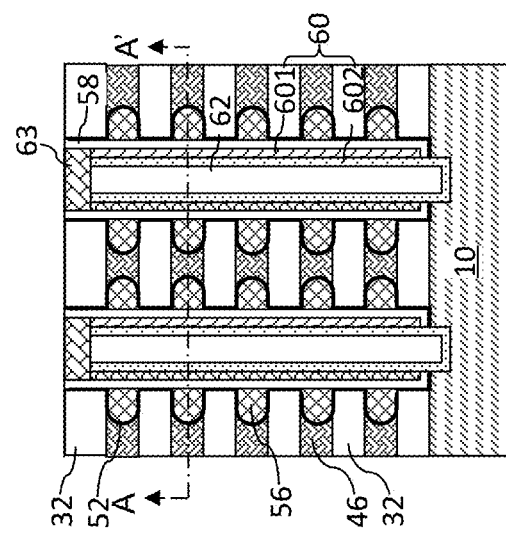
FIG. 16B is a vertical cross-sectional view of the second exemplary device structure along the vertical plane B-B' of FIG. 16A. The plane A-A' corresponds to the horizontal cross-sectional plane of FIG. 16A.

Referring to FIGS. 16A and 16B, a second exemplary device structure according to a second embodiment of the present disclosure can be derived from the first exemplary structure by selecting the dimensions of the metal portions 54 as formed at the processing steps of FIGS. 10A and 10B and the parameters of the anneal process employed to form metal-semiconductor alloy portions 56 at the processing steps of FIGS. 12A and 12B such that the entirety of each metal portion 54 is consumed during formation of the metal semiconductor alloy portions 56. In other words, the entirety of each of the discrete portions of the first material reacts with the second material to form the metal-semiconductor alloy portions 56 in the lateral cavities. In this case, each floating gate electrode can consist of a respective metal-semiconductor alloy (e.g., metal silicide) portion 56.

A pair of physically disjoined (i.e., non-contacting) metal-semiconductor alloy portions 56 can be formed within each pair of lateral cavities 49C within a memory opening 49. In one embodiment, the temperature and duration of the anneal process can be selected such that the interface between a metal-semiconductor alloy portion 56 and a remaining unreacted portion of the semiconductor material layer 57L is substantially vertically coincident with sidewalls of the insulating layers 32 around a respective memory opening 49. Subsequently, the processing steps of FIGS. 13A, 13B, 14A, 14B, 15A, and 15B can be performed to provide the second exemplary device structure illustrated in FIGS. 16A and 16B. Each contiguous set of an optional dielectric core 62, a semiconductor channel 60, a tunneling dielectric layer 58, floating gate electrodes 56 contacting the tunneling dielectric layer 58, and a blocking dielectric layer 52 collectively constitutes a memory stack structure (62, 60, 58, 56, 52). Each memory opening 49 includes a respective memory stack structure (62, 60, 58, 56, 52), which can be incorporated as an instance of the memory stack structure 55 into the exemplary structure of FIG. 1.

Referring to FIGS. 17A and 17B, a third exemplary device structure according to the third embodiment of the present disclosure can be the same as the first exemplary structure illustrated in FIGS. 8A and 8B. However, in the subsequent steps of this third embodiment, the order of deposition of the metal and semiconductor layers is reversed compared to the first and the second embodiments.

Referring to FIGS. 18A and 18B, a first material layer can be deposited on the blocking dielectric layer 52 to fill the lateral cavities 49C. The first material layer includes a first material, and is deposited as a continuous material layer over the blocking dielectric layer 52. The thickness of the first material layer is selected such that the entirety of each lateral cavity 49C is filled by the first material layer. The first material layer can be deposited by a conformal deposition method such as chemical vapor deposition or atomic layer deposition. The first material layer includes vertical portions covering sidewalls of the memory openings 49, lower horizontal portions located at the bottom of each memory opening 49, and an upper horizontal portion located above the alternating stack (32, 46). A vertical cavity 49' is formed at a center portion of each memory opening 49.

In this embodiment, the first material layer can be a semiconductor material layer 57L including at least one metal that forms a metal-semiconductor alloy. For example, the semiconductor material layer 57L can include one or more of silicon, germanium, a silicon-containing semiconductor alloy (such as a silicon-germanium alloy or a silicon-germanium-carbon alloy), or a germanium-containing semiconductor alloy. In one embodiment, the semiconductor material layer 57L can include amorphous silicon or polycrystalline silicon.

Figure 19A:
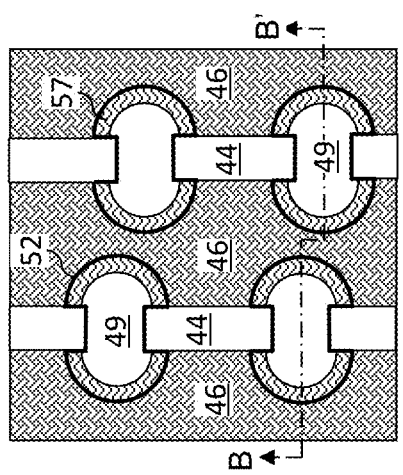
FIG. 19A is a horizontal cross-sectional view of the third exemplary device structure after formation of semiconductor portions by recessing the first material layer according to the third embodiment of the present disclosure.
Figure 19B:
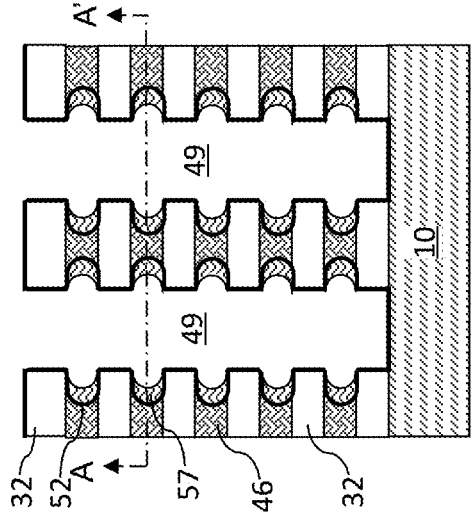
FIG. 19B is a vertical cross-sectional view of the third exemplary device structure along the vertical plane B-B' of FIG. 19A. The plane A-A' corresponds to the horizontal cross-sectional plane of FIG. 19A.

Referring to FIGS. 19A and 19B, an isotropic or anisotropic etch process, such as an RIE process, can be performed to remove a horizontal portion of the semiconductor material layer 57L from above the alternating stack (32, 46), and portions of the semiconductor material layer 57L within each vertically extending volume 49V of the memory openings 49. The chemistry of the etch can be selected to remove the first material of the semiconductor material layer 57L selective to the material of the blocking dielectric layer 52. After removal of the first material of the semiconductor material layer 57L from within the vertically extending volume 49V of each memory opening 49, the etch proceeds further so that the first material is laterally recessed at the levels of the electrically conductive layers 46. The duration of the etch can be selected so that a remaining portion of the first material of the semiconductor material layer 57L is present within each lateral cavity 49C inside the concave sidewalls of the blocking dielectric layer 53 at each level of the electrically conductive layers 46. A discrete remaining portion of the semiconductor material layer 57L is present within each volume of the lateral cavities 49C, and constitute a respective semiconductor material portion 57. The maximum lateral thickness of each semiconductor material portion 57 can be in a range from 1 nm to 10 nm, although lesser and greater maximum lateral thicknesses can also be employed. The semiconductor material portions 57 can have a concave side surface facing the memory opening 49 and leave a portion of the lateral cavities 49C adjacent to the volume 49V unfilled.

Figure 20A:
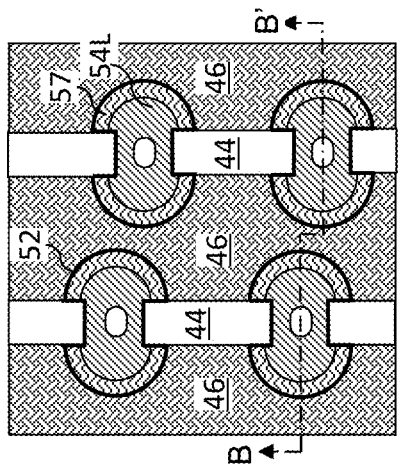
FIG. 20A is a horizontal cross-sectional view of the third exemplary device structure after deposition of a semiconductor material as a second material layer according to the third embodiment of the present disclosure.
Figure 20B:
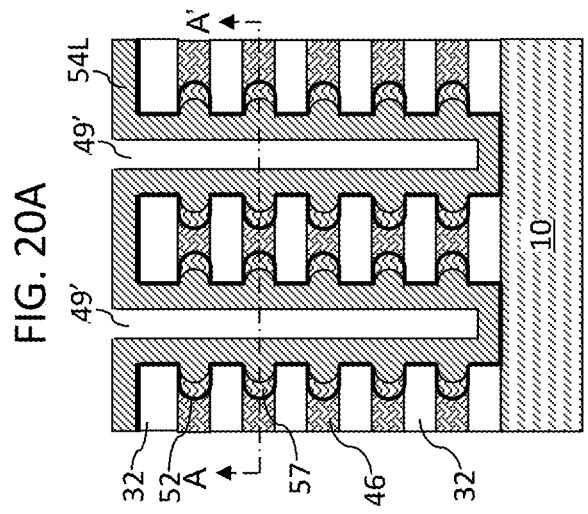
FIG. 20B is a vertical cross-sectional view of the third exemplary device structure along the vertical plane B-B' of FIG. 20A. The plane A-A' corresponds to the horizontal cross-sectional plane of FIG. 20A.

Referring to FIGS. 20A and 20B, a second material layer can be deposited on the discrete portions of the first material, which are embodied as the semiconductor material portions 57, to fill remaining volumes of the lateral cavities 49C. The second material layer includes a second material, and is deposited as a continuous material layer over the semiconductor material portions 57 and the blocking dielectric layer 52. The thickness of the second material layer is selected such that the entirety of each remaining volume of the lateral cavities 49C is filled by the second material layer. The second material layer can be deposited by a conformal deposition method such as chemical vapor deposition or atomic layer deposition. The second material layer includes vertical portions covering sidewalls of the memory openings 49, lower horizontal portions located at the bottom of each memory opening 49, and an upper horizontal portion located above the alternating stack (32, 46). A vertical cavity 49' is formed at a center portion of each memory opening 49.

In one embodiment, the second material layer can be a metal layer 54L including at least one elemental metal. The metal layer 54L includes a metal that forms a metal-semiconductor alloy with the first material, i.e., the semiconductor material, of the semiconductor material portions 57. For example, the metal layer 54L can include one or more of nickel, titanium, cobalt, tungsten, molybdenum, tantalum and platinum. The metal layer 54L can consist essentially of a single elemental metal, or can include an intermetallic alloy of at least two elemental metals.

Figure 21A:
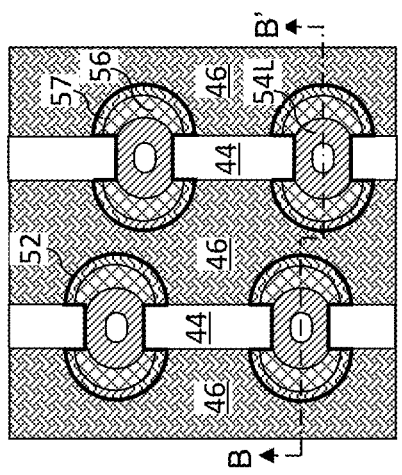
FIG. 21A is a horizontal cross-sectional view of the third exemplary device structure after formation of metal-semiconductor alloy portions through an anneal process according to the third embodiment of the present disclosure.
Figure 21B:
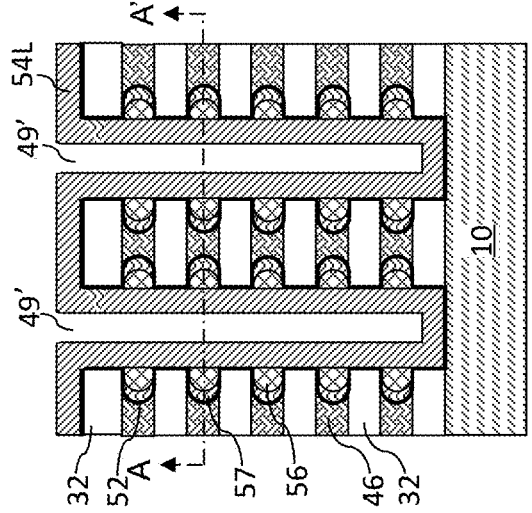
FIG. 21B is a vertical cross-sectional view of the third exemplary device structure along the vertical plane B-B' of FIG. 21A. The plane A-A' corresponds to the horizontal cross-sectional plane of FIG. 21A.

Referring to FIGS. 21A and 21B, an anneal process is performed at an elevated temperature to induce formation of a metal-semiconductor alloy through reaction of the first material (i.e., at least one metal) in the semiconductor material portions 57 and the second material (i.e., a semiconductor material) in the metal layer 54L. The elevated temperature can be in a range from 500 degrees Celsius to 900 degrees Celsius depending on the materials of the semiconductor material portions 57 and the metal layer 54L. The duration of the anneal process can be in a range from 10 seconds to 1 hour, although shorter and longer durations can also be employed.

A metal-semiconductor alloy portion 56 (e.g., the metal silicide or germanide portions described with respect to the first embodiment) is formed within each volume of the lateral cavities 49C. In one embodiment, the temperature and duration of the anneal process can be selected so that a fraction of each portion of the first material (i.e., a fraction of each semiconductor material portion 57) does not react with the second material of the metal layer 54L during formation of the metal-semiconductor alloy portions 56. A respective remaining semiconductor material portion 57, which is a first material portion, is present within each volume of the lateral cavities 49C after the anneal process.

A pair of physically disjoined (i.e., non-contacting) metal-semiconductor alloy portions 56 can be formed within each pair of lateral cavities 49C within a memory opening 49. In one embodiment, the temperature and duration of the anneal process can be selected such that the interface between a metal-semiconductor alloy portion 56 and a remaining unreacted portion of the metal layer 54L is substantially vertically coincident with sidewalls of the insulating layers 32 around a respective memory opening 49.

Figure 22A:
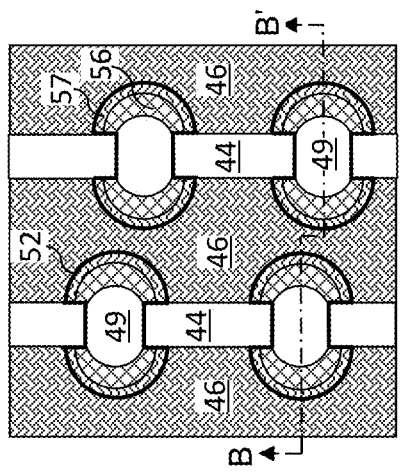
FIG. 22A is a horizontal cross-sectional view of the third exemplary device structure after removal of unreacted portions of the second material layer according to the third embodiment of the present disclosure.
Figure 22B:
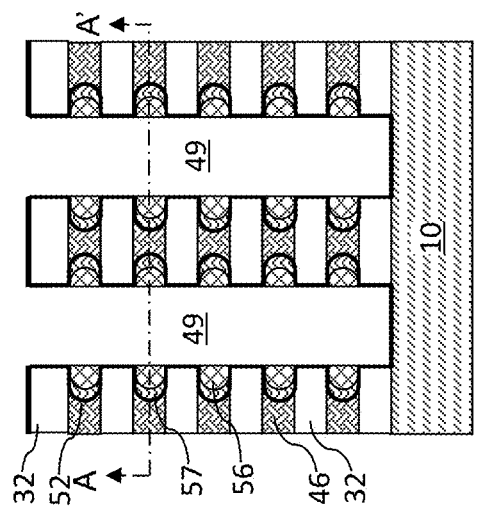
FIG. 22B is a vertical cross-sectional view of the third exemplary device structure along the vertical plane B-B' of FIG. 22A. The plane A-A' corresponds to the horizontal cross-sectional plane of FIG. 22A.

Referring to FIGS. 22A and 22B, unreacted portions of the metal layer 54L can be removed selective to the metal-semiconductor alloy portions 56 and optionally selective to the blocking dielectric layer 52. For example, if the metal layer 54L includes tungsten, a wet etch employing a mixture of hydrofluoric acid and nitric acid can be employed to remove the second material of the metal layer 54L selective to the metal-semiconductor alloy portions 56 and the blocking dielectric layer 52. If the metal layer 54L includes cobalt, a wet etch employing a mixture of hydrochloric acid and hydrogen peroxide can be employed to remove the second material of the metal layer 54L selective to the metal-semiconductor alloy portions 56 and the blocking dielectric layer 52. The amount of deposited material in the lateral cavities 49C, the temperature of the anneal for forming a metal silicide, and removal of unreacted material after the silicide formation process can be controlled to eliminate and/or minimize formation of bumps and/or dimples on the sidewalls of the metal-semiconductor alloy portions 56. Thus, the inner sidewalls of the metal-semiconductor alloy portions 56 can have substantially vertical surfaces. For example, the lateral protrusion or recessing of the sidewalls of the metal-semiconductor alloy portions 56 from the inner sidewalls of the blocking dielectric layer 52 may be less than the thickness of the blocking dielectric layer 52.

Figure 23A:
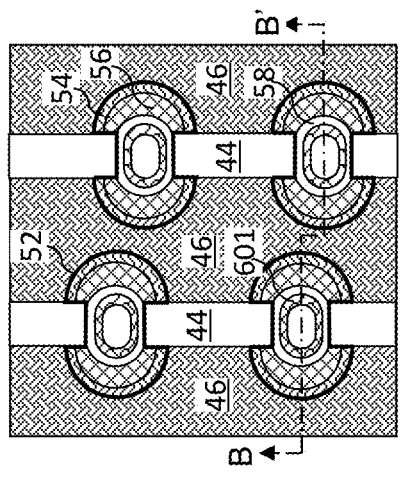
FIG. 23A is a horizontal cross-sectional view of the third exemplary device structure after formation of a tunneling dielectric layer and a first semiconductor material layer in each memory opening according to the third embodiment of the present disclosure.
Figure 23B:
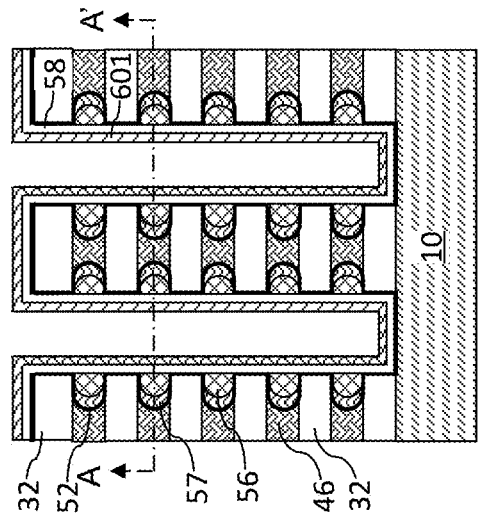
FIG. 23B is a vertical cross-sectional view of the third exemplary device structure along the vertical plane B-B' of FIG. 23A. The plane A-A' corresponds to the horizontal cross-sectional plane of FIG. 23A.

Referring to FIGS. 23A and 23B, a tunneling dielectric layer 58 and an optional first semiconductor channel layer 601 can be formed by performing the processing steps of FIGS. 14A and 14B.

Figure 24A:
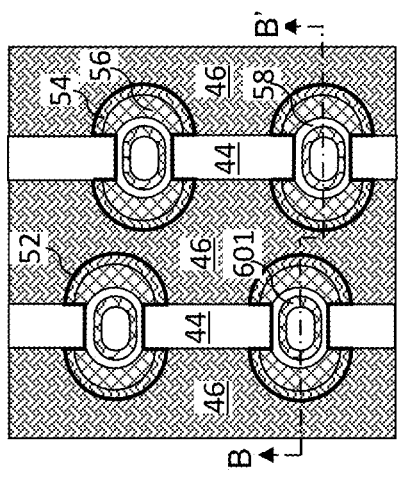
FIG. 24A is a horizontal cross-sectional view of the third exemplary device structure after formation of a dielectric core and a drain region in each memory opening according to the third embodiment of the present disclosure.
Figure 24B:
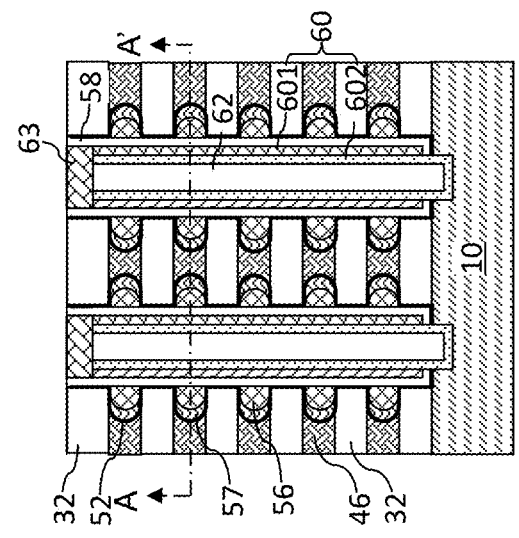
FIG. 24B is a vertical cross-sectional view of the third exemplary device structure along the vertical plane B-B' of FIG. 24A. The plane A-A' corresponds to the horizontal cross-sectional plane of FIG. 24A.

Referring to FIGS. 24A and 24B, the processing steps of FIGS. 15A and 15B can be performed to remove horizontal portions of the optional first semiconductor channel layer 601, the tunneling dielectric layer 58, and the blocking dielectric layer 52, and to form a second semiconductor channel layer 602, a dielectric core 62, and a drain region 63 within each memory opening 49. Each contiguous set of an optional dielectric core 62, a semiconductor channel 60, a tunneling dielectric layer 58, semiconductor and metal-semiconductor alloy floating gate electrodes (57, 56) contacting the tunneling dielectric layer 58, and a blocking dielectric layer 52 collectively constitutes a memory stack structure (62, 60, 58, 56, 57, 52). Each memory opening 49 includes a respective memory stack structure (62, 60, 58, 56, 57, 52), which can be incorporated as an instance of the memory stack structure 55 into the exemplary structure of FIG. 1.

Figure 25A:
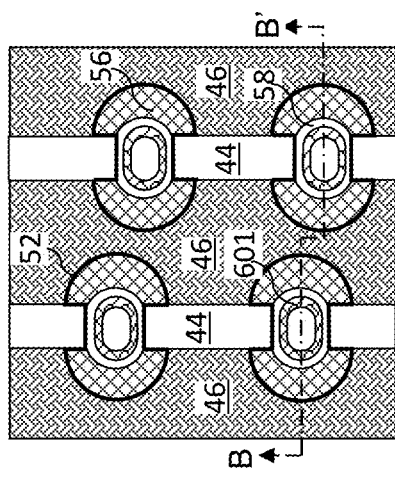
FIG. 25A is a top down view of a fourth exemplary device structure that can be incorporated into an array region of the exemplary structure of FIG. 1 according to a fourth embodiment of the present disclosure.
Figure 25B:
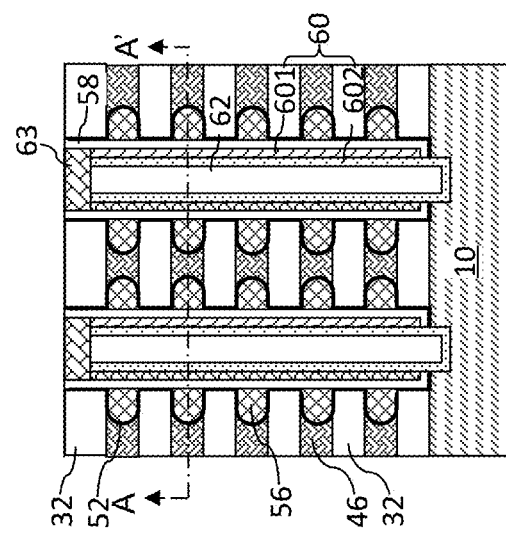
FIG. 25B is a vertical cross-sectional view of the third exemplary device structure along the vertical plane B-B' of FIG. 25A. The plane A-A' corresponds to the horizontal cross-sectional plane of FIG. 25A.

Referring to FIGS. 25A and 25B, a fourth exemplary device structure according to a fourth embodiment of the present disclosure can be derived from the third exemplary structure by selecting the dimensions of the semiconductor portions 57 as formed at the processing steps of FIGS. 19A and 19B and the parameters of the anneal process employed to form metal-semiconductor alloy portions 56 at the processing steps of FIGS. 21A and 21B such that the entirety of each semiconductor material portion 57 is consumed during formation of the metal semiconductor alloy portions 56. In other words, the entirety of each of the discrete portions of the first material reacts with the second material to form the metal-semiconductor alloy portions 56 in the lateral cavities. In this case, each floating gate electrode can consist only of a respective metal-semiconductor alloy portion 56 (e.g., silicide portion).

A pair of physically disjoined (i.e., non-contacting) metal-semiconductor alloy portions 56 can be formed within each pair of lateral cavities 49C within a memory opening 49. In one embodiment, the temperature and duration of the anneal process can be selected such that the interface between a metal-semiconductor alloy portion 56 and a remaining unreacted portion of the metal layer 54L is substantially vertically coincident with sidewalls of the insulating layers 32 around a respective memory opening 49. Subsequently, the processing steps of FIGS. 22A, 22B, 23A, 23B, 24A, and 24B can be performed to provide the second exemplary device structure illustrated in FIGS. 25A and 25B. Each contiguous set of an optional dielectric core 62, a semiconductor channel 60, a tunneling dielectric layer 58, floating gate electrodes 56 contacting the tunneling dielectric layer 58, and a blocking dielectric layer 52 collectively constitutes a memory stack structure (62, 60, 58, 56, 52). Each memory opening 49 includes a respective memory stack structure (62, 60, 58, 56, 52), which can be incorporated as an instance of the memory stack structure 55 into the exemplary structure of FIG. 1.

Figure 26:
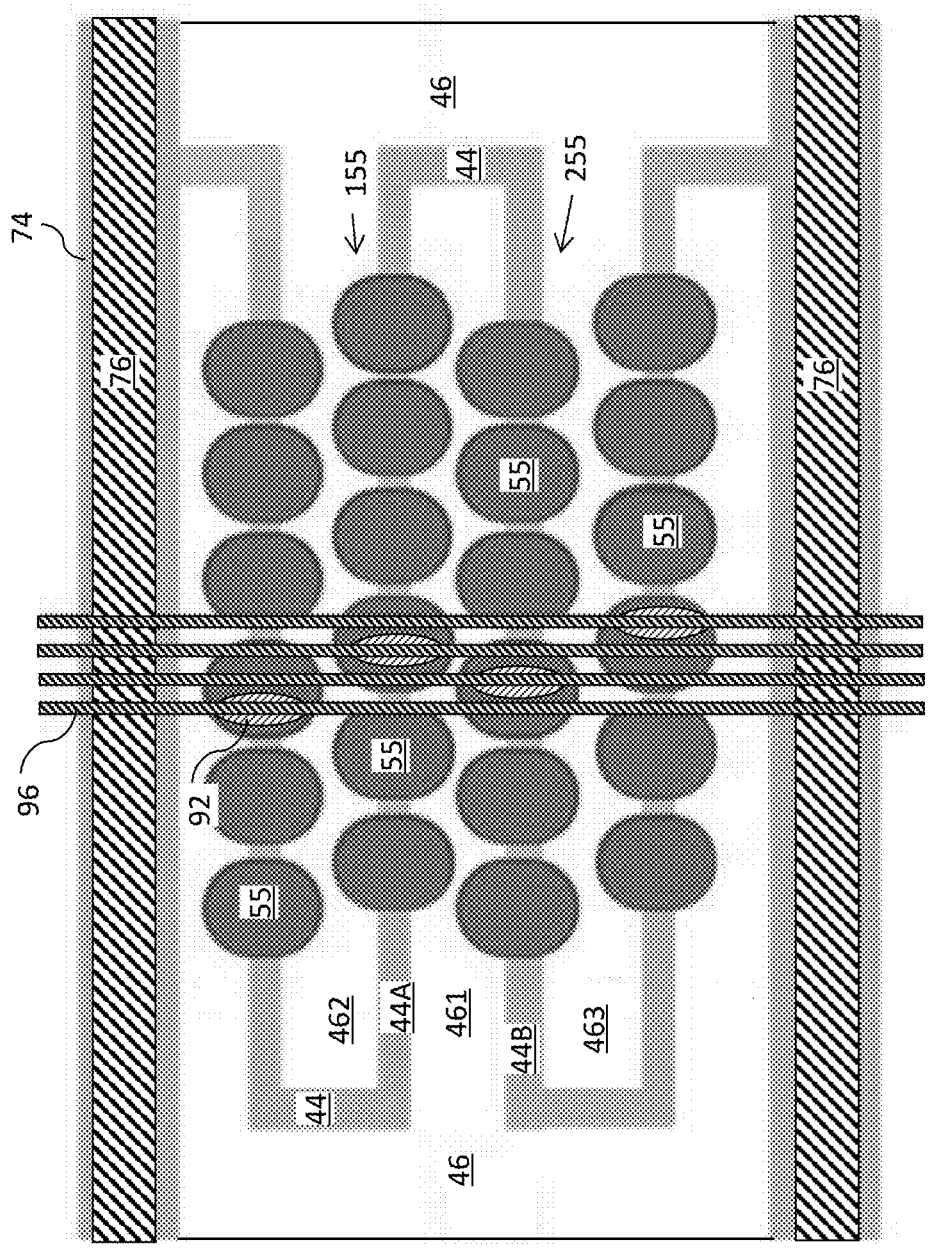
FIG. 26 is a see-through top-down view of the exemplary device structure that illustrates global shapes of various components of the exemplary structure according to the embodiments of the present disclosure.
Figure 27:
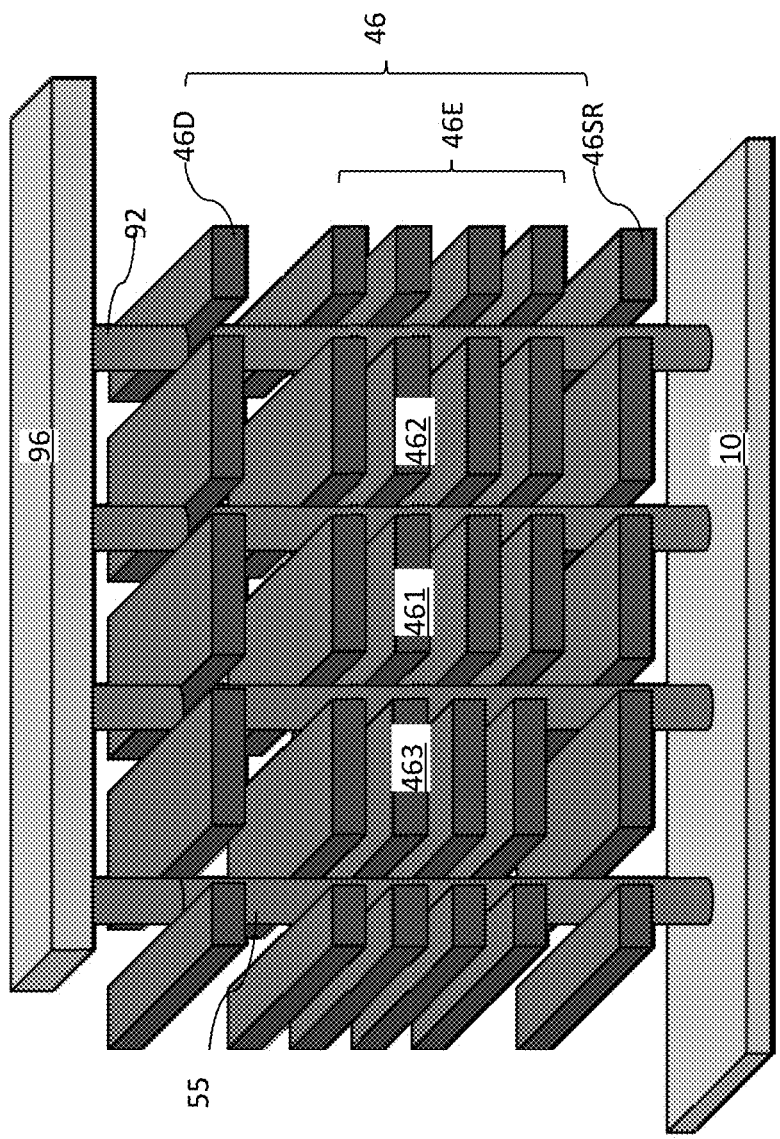
FIG. 27 is a perspective view of an array region of the first exemplary device structure according to the embodiments of the present disclosure.

Referring to FIGS. 26 and 27, the exemplary structures of the present disclosure can include a memory device, which comprises a stack of alternating layers comprising insulating layers 32 and electrically conductive layers 46 located over a substrate 8, a memory stack structure 55 located within a memory opening extending through the stack, and including semiconductor channel 60 having a vertical portion that extends along a direction perpendicular to a top surface of the substrate 8. Each of the electrically conductive layers 46 can include a metallic liner contacting at least one of the insulating layers 32, and a metallic fill material portion surrounded by the metallic liner and comprising at least one metal.

In one embodiment, each memory stack structure 55 may comprise multiple sets of at least two charge storage elements located around the semiconductor channel 60 at each level of the electrically conductive layers 46. Each set of at least two charge storage elements comprises charge storage elements that are located at the same level as a respective electrically conductive layer 46, and are electrically isolated from the semiconductor channel 60 by at least one respective tunneling dielectric 58, and from respective control gate electrodes (which are adjacent portions of the electrically conductive layers 46) thereof by the blocking dielectric layer 52. The electrically conductive layers 46 can comprise control gate electrodes 46E, source select gate electrodes 46SR, and drain select gate electrodes 46D.

The dielectric separator structures 44 extend through the stack, and laterally separate the control gate electrodes 46 of the plurality of charge storage elements, which are embodied as floating gate electrodes {56, (54, 56), or (56, 57)}.

A first row 155 and second row 255 of memory stack structures 55 extend through the respective first and second dielectric separator structures (44A, 44B) as shown in FIG. 26. A continuous first control gate electrode 461 extends between the first 44A and the second 44B dielectric separator structures. Control gate electrode 461 is located adjacent to a first (right) side of the first dielectric separator structure 44A, adjacent to a first (right) side of the first row 155 of the memory stack structures, adjacent to a first (left) side of the second dielectric separator structure 44B, and adjacent to a first (left) side of the second row 255 of the memory stack structures 55.

A second control gate electrode 462 is located adjacent to a second (left) side of the first dielectric separator structure 44A, and adjacent to the second (left) side of the first row 155 of the memory stack structures. A third control gate electrode 463 is located adjacent to a second (right) side of the second row 255 of the memory stack structures, and adjacent to a second (right) side of the second dielectric separator structure 44B. Electrodes 462 and 463 may comprise finger portions of the same comb shaped word line 46B, while electrode 461 may comprise a finger portion of a different comb shaped word line 46A.

In one embodiment, each of the memory stack structures 55 can comprise a vertical stack of memory cells. Each memory cell can comprises a first charge storage element that can store one bit of information, and a second charge storage element that is electrically isolated from the first charge storage element and capable of storing another bit of information. The pair of charge storage elements are embodied as a pair of floating gate electrodes {56, (54, 56), or (56, 57)} located at the same level, which is a level of an electrically conductive layer 46. The floating gate electrodes may consist of the metal-semiconductor alloy 56, or may comprise an outer metal 54 or semiconductor 57 portion and an inner metal-semiconductor alloy portion 56.

Dielectric separator structures 44 can contact sidewalls of the plurality of memory stack structures 55. Each of the electrically conductive layers 46 can comprise a plurality of portions (e.g., 461, 462, 463) that are spaced from one another by the dielectric separator structures 44.

As shown in FIG. 27, a plurality of bit lines 96 may be located above the alternating stack (32, 46). Drain contact via structures (e.g., drain electrodes) 92 may connect each drain 63 to the respective bit line 96.

The various exemplary structures of the present disclosure can include a three-dimensional memory device. The three-dimensional memory device can include: an alternating stack of insulating layers 42 and electrically conductive layers 46 located over a substrate 8; memory openings 49 vertically extending through the alternating stack (32, 46), wherein each memory opening 49 comprises a vertically extending volume 49V of a substantially uniform horizontal cross-sectional area and pairs of lateral cavities 49C physically spaced from each other and located around, and adjoined to, the vertically extending volume 49V at each level of the electrically conductive layers 46; and dielectric separator structures 44 vertically extending through the alternating stack (32, 46) and laterally extending between a respective neighboring pair of vertically extending volumes 49V. Each lateral cavity 49C among the pairs of lateral cavities 49C includes a portion of a respective blocking dielectric layer 52 and a respective metal-semiconductor alloy portion 56. Each vertically extending volume 49V includes a respective tunneling dielectric layer 58 and a respective semiconductor channel layer 60.

In one embodiment, the vertically extending volume 49V is laterally bounded by vertically coincident sidewalls of the insulating layers 32. Each pair of lateral cavities 49C is located at a level of a respective electrically conductive layer 46 and is adjoined to the vertically extending volume 49V. In one embodiment, the pairs of lateral cavities 49C are laterally bounded by sidewalls of the dielectric separator structures 44. In one embodiment, each memory opening 49 includes a pair of physically disjoined metal-semiconductor alloy portions 56 at each level of the electrically conductive layers 46. In one embodiment, each portion of a blocking dielectric layer 52 in the lateral cavities 49C contacts a respective electrically conductive layer 46, an overlying insulating layer 32, and an underlying insulating layer 32.

In one embodiment, the tunneling dielectric layer 58 contacts an inner surface of the blocking dielectric layer 52 at each level of the insulating layers 32. In one embodiment, the semiconductor channel layer 60 contacts an inner sidewall of the tunnel dielectric layer 58, laterally encloses a dielectric core 62, and contacts a bottom surface of a drain region 63 located in an upper portion of a respective memory opening 49.

In one embodiment, an entire set of surfaces of each metal-semiconductor alloy portion 56 can be in physical contact with, and can be encapsulated by, surfaces selected from surfaces of the blocking dielectric layer 52 and surfaces of the tunneling dielectric layer 58 as illustrated in FIGS. 16A, 16B, 25A, and 25B.

In one embodiment, each pair of lateral cavities 49C comprises a pair of metal-semiconductor alloy portions 56 located at a level of one of the electrically conductive layers 46 and physically spaced from each other by a combination of a tunneling dielectric layer 58, a blocking dielectric layer 52, and a pair of dielectric separator structures 44.

In one embodiment, each blocking dielectric layer 52 contacts concave sidewalls of two physically disjoined portions of a respective electrically conductive layer (such as 461 and 462) and sidewalls of two distinct dielectric separator structures 44 at each level including a pair of lateral cavities 49C.

In one embodiment, each metal-semiconductor alloy portion 56 contacts a concave sidewall of a respective blocking dielectric layer 52 and an outer sidewall of a respective tunneling dielectric layer 58 as illustrated in FIGS. 16A, 16B, 25A, and 25B.

In one embodiment, each metal-semiconductor alloy portion 56 contacts an outer sidewall of a respective tunneling dielectric layer 58 and an inner sidewall of a respective semiconductor material portion 57 contacting a respective blocking dielectric layer 52 as illustrated in FIGS. 24A and 24B.

In one embodiment, each metal-semiconductor alloy portion 56 contacts an outer sidewall of a respective tunneling dielectric layer 58 and an inner sidewall of a respective metal portion 54 contacting a respective blocking dielectric layer 52 as illustrated in FIGS. 15A and 15B. The metal portion 54 comprises the same metal as the metal in the metal-semiconductor alloy portion 56.

In one embodiment, the memory device can be a monolithic three-dimensional memory device that comprises a vertical NAND device located over the substrate 8. The electrically conductive layers 46 can comprise, or can be electrically connected to, a respective word line of the vertical NAND device. The substrate 8 can comprise a silicon substrate. The vertical NAND device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprise a plurality of semiconductor channels. At least one end portion of each of the plurality of semiconductor channels can extend substantially perpendicular to a top surface of the substrate 8. The array of monolithic three-dimensional NAND strings can further include a plurality of charge storage element, and a plurality of control gate electrodes having a strip shape extending substantially parallel to the top surface of the substrate 8. Each charge storage element can be located adjacent to a respective one of the plurality of semiconductor channels. The plurality of control gate electrodes can comprise at least a first control gate electrode located in the first device level and a second control gate electrode located in the second device level.

The various methods and structures of the present disclosure provide azimuthally-split metal-semiconductor alloy portions 56 that can be employed as a pair of floating gate electrodes at each level of electrically conductive layers 46. The split metal-semiconductor alloy portions 56 preferably have a straight inner sidewall that is aligned with the inner sidewalls of the insulating layers 32 facing the volume 49V of the memory opening 49. This permits deposition of the tunneling dielectric layer 58 and the semiconductor channel 60 with straight outer sidewalls over the straight inner sidewalls of the insulating layer 32 and portions 56. The straight outer sidewalls can improve device performance. Furthermore, hybrid floating gates including the inner alloy portion 56 and outer metal 54 or semiconductor 57 portion can be formed.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers located over a substrate;
   memory openings vertically extending through the alternating stack, wherein each memory opening comprises a vertically extending volume and pairs of lateral cavities physically spaced from each other and located around, and adjoined to, the vertically extending volume at each level of the electrically conductive layers; and
   dielectric separator structures vertically extending through the alternating stack and laterally extending between a respective neighboring pair of vertically extending volumes, wherein:
   each lateral cavity among the pairs of lateral cavities includes a portion of a respective blocking dielectric layer and a respective metal-semiconductor alloy portion; and
   each vertically extending volume includes a respective tunneling dielectric layer and a respective semiconductor channel layer.

2. The three-dimensional memory device of claim 1, wherein:
   the electrically conductive layers comprise control gate electrodes;
   the metal-semiconductor alloy portion comprises at least a portion of a floating gate;
   the vertically extending volume has a substantially uniform horizontal cross-sectional area;
   the vertically extending volume is laterally bounded by vertically coincident sidewalls of the insulating layers, wherein each pair of lateral cavities is located at a level of a respective electrically conductive layer and is adjoined to the vertically extending volume.

3. The three-dimensional memory device of claim 1, wherein the pairs of lateral cavities are laterally bounded by sidewalls of the dielectric separator structures.

4. The three-dimensional memory device of claim 1, wherein each memory opening includes a pair of physically disjoined metal-semiconductor alloy portions at each level of the electrically conductive layers.

5. The three-dimensional memory device of claim 1, wherein each portion of a blocking dielectric layer in the lateral cavities contacts a respective electrically conductive layer, an overlying insulating layer, and an underlying insulating layer.

6. The three-dimensional memory device of claim 1, wherein:
   the tunneling dielectric layer contacts an inner surface of the blocking dielectric layer at each level of the insulating layers; and
   the semiconductor channel layer contacts an inner sidewall of the tunnel dielectric layer, laterally encloses a dielectric core, and contacts a bottom surface of a drain region located in an upper portion of a respective memory opening.

7. The three-dimensional memory device of claim 1, wherein each metal-semiconductor alloy portion comprises a silicide of nickel, titanium, cobalt, tungsten, molybdenum, tantalum or platinum.

8. The three-dimensional memory device of claim 1, wherein an entire set of surfaces of each metal-semiconductor alloy portion is in physical contact with and encapsulated by a surface of the blocking dielectric layer and a surface of the tunneling dielectric layer.

9. The three-dimensional memory device of claim 1, wherein each pair of lateral cavities comprises a pair of metal-semiconductor alloy portions located at a level of one of the electrically conductive layers and physically spaced from each other by a combination of a tunneling dielectric layer, a blocking dielectric layer, and a pair of dielectric separator structures.

10. The three-dimensional memory device of claim 1, wherein each blocking dielectric layer contacts concave sidewalls of two physically disjoined portions of a respective electrically conductive layer and sidewalls of two distinct dielectric separator structures at each level including a pair of lateral cavities.

11. The three-dimensional memory device of claim 1, wherein each metal-semiconductor alloy portion contacts a concave sidewall of a respective blocking dielectric layer and an outer sidewall of a respective tunneling dielectric layer.

12. The three-dimensional memory device of claim 1, wherein each metal-semiconductor alloy portion contacts an outer sidewall of a respective tunneling dielectric layer and an inner sidewall of a respective semiconductor material portion contacting a respective blocking dielectric layer.

13. The three-dimensional memory device of claim 1, wherein each metal-semiconductor alloy portion contacts an outer sidewall of a respective tunneling dielectric layer and an inner sidewall of a respective metal portion contacting a respective blocking dielectric layer.

14. The three-dimensional memory device of claim 1, wherein:

the three-dimensional memory device comprises a vertical NAND device located in a device region;

the electrically conductive layers comprise, or are electrically connected to a respective word line of the vertical NAND device;

the device region comprises:

a plurality of semiconductor channels, wherein at least one end portion of each of the plurality of semiconductor channels extends substantially perpendicular to a top surface of the substrate;

a plurality of charge storage regions, each charge storage region located adjacent to a respective one of the plurality of semiconductor channels; and a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the stack are in electrical contact with the plurality of control gate electrode and extend from the device region to a contact region including the plurality of electrically conductive via connections; and the substrate comprises a silicon substrate containing a driver circuit for the NAND device.

15. The three-dimensional memory device of claim 1, wherein each blocking dielectric layer continuously extends from a bottommost one of the electrically conductive layers within the alternating stack to a topmost one of the electrically conductive layers within the alternating stack.

* * * * *